United States Patent [19]
Hirosawa

[11] Patent Number: 6,044,708
[45] Date of Patent: Apr. 4, 2000

[54] OSCILLATION TYPE GYROSCOPE

[75] Inventor: Nobuyuki Hirosawa, Miyagi-ken, Japan

[73] Assignee: Alps Electric Co., Ltd., Tokyo, Japan

[21] Appl. No.: 09/256,529

[22] Filed: Feb. 24, 1999

[30] Foreign Application Priority Data

Apr. 3, 1998 [JP] Japan .................................. 10-052145

[51] Int. Cl.⁷ .................................................. G01P 9/00
[52] U.S. Cl. ........................................................ 73/504.15
[58] Field of Search ........................... 73/504.12, 504.15, 73/504.16, 504.08, 503.3, 504.18

[56] References Cited

U.S. PATENT DOCUMENTS

| 5,889,208 | 3/1999 | Nose | 73/504.16 |
| 5,894,090 | 4/1999 | Tang et al. | 73/504.02 |

FOREIGN PATENT DOCUMENTS 9-126783  5/1997  Japan .

*Primary Examiner*—William Oen
*Attorney, Agent, or Firm*—Brinks Hofer Gilson & Lione

[57] ABSTRACT

The oscillation type gyroscope comprises an oscillator having electrodes for driving and for detection and also having oscillating arms adapted to oscillate in a cantilevered state, with front end portions of the oscillating arms being free ends; a support member for supporting a base end portion of the oscillator; a circuit board to which the support member is secured; a flexible printed circuit board with wiring patterns formed thereon and having oscillator-side end portions, a circuit board-side end portion and a wiring portion; first connecting portions provided in the oscillator-side end portions, conducted with the wiring patterns and connected to corresponding electrodes electrically by soldering at the base end portion of the oscillator; and a second connecting portion provided in the circuit board-side end portion, conducted with the wiring patterns and connected electrically to the circuit board at the circuit board-side end portion, wherein among the electrodes, those which lie in the same plane and which become equal in potential at the time of polarization and in use, are gathered as one group at the base end portion of the oscillator.

8 Claims, 18 Drawing Sheets

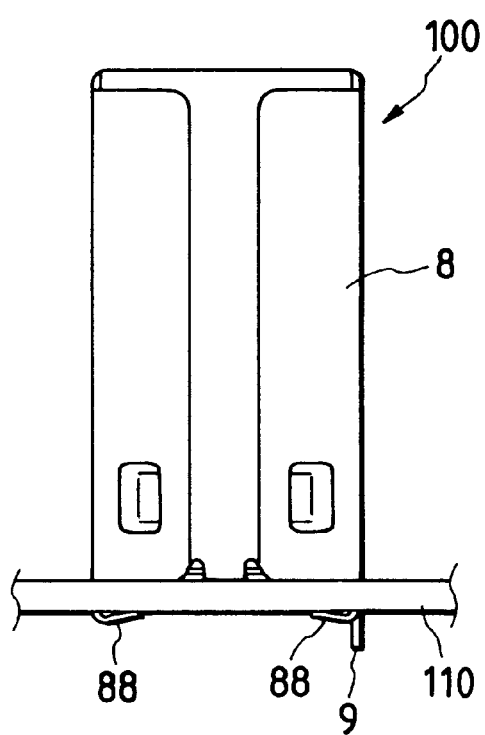

FIG. 2A
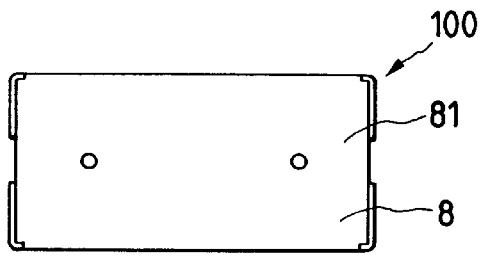
FIG. 2B  FIG. 2D  FIG. 2E
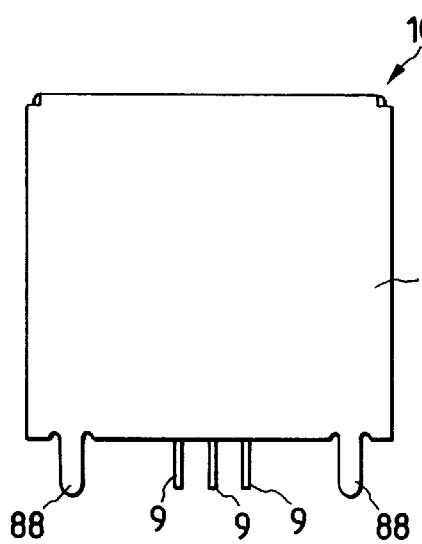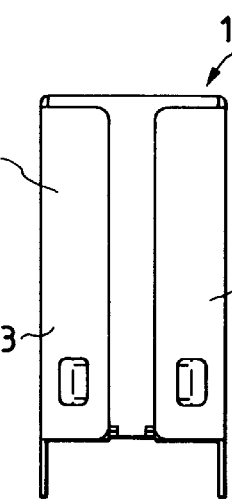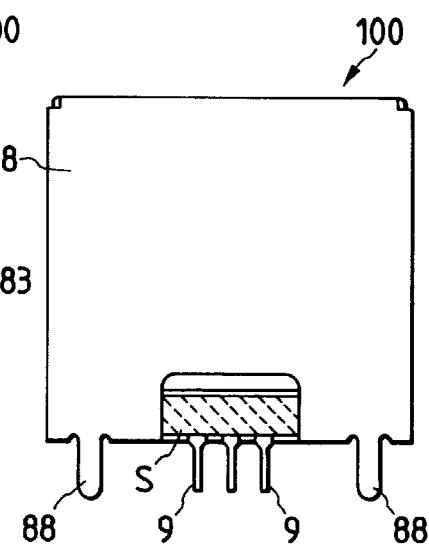
FIG. 2C
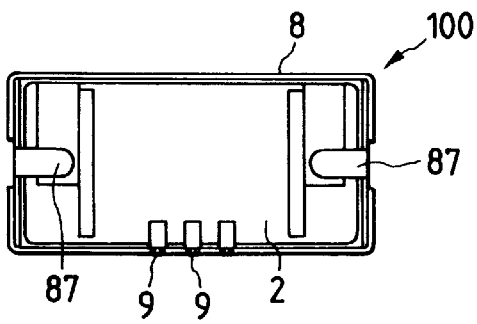

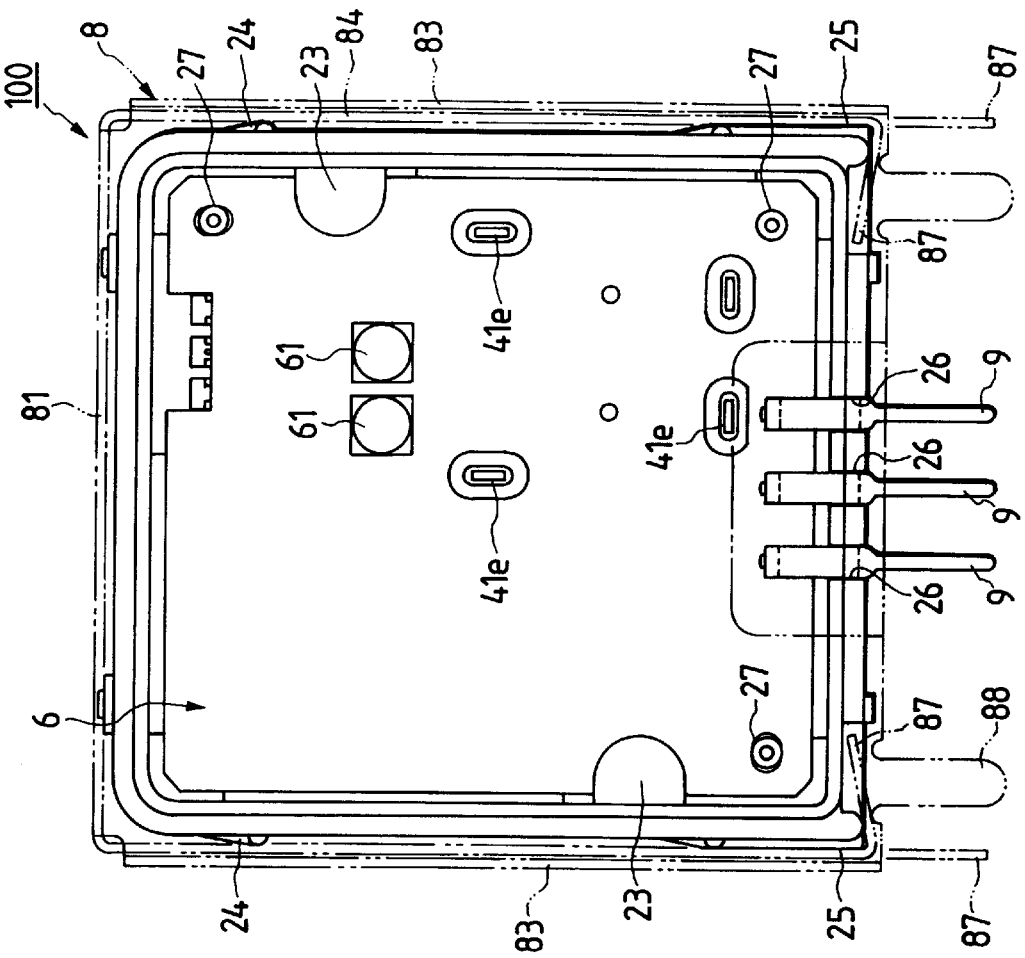
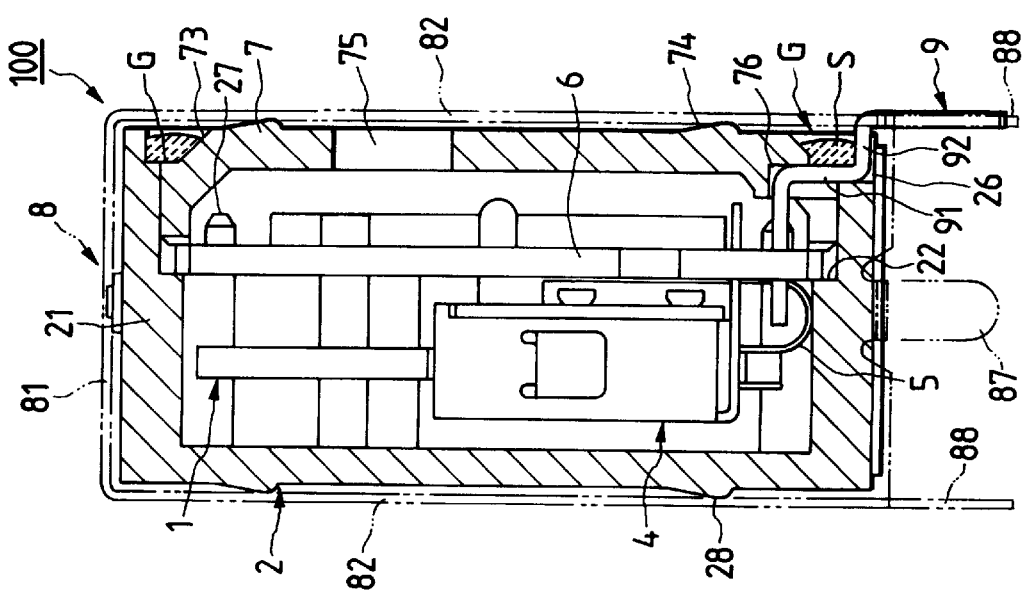
FIG. 3A
FIG. 3B

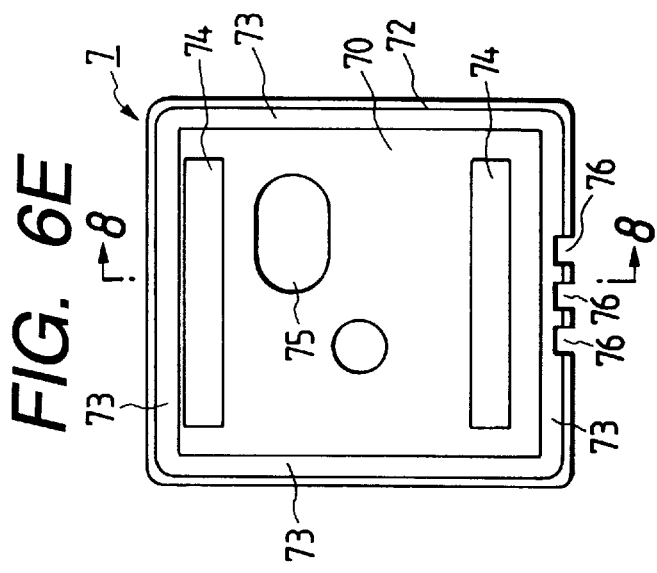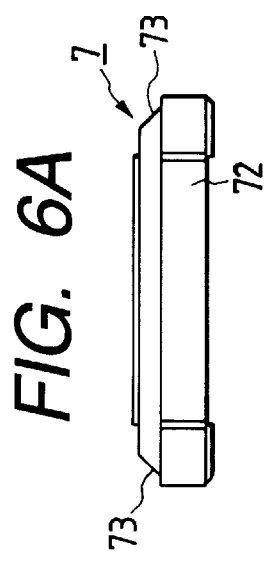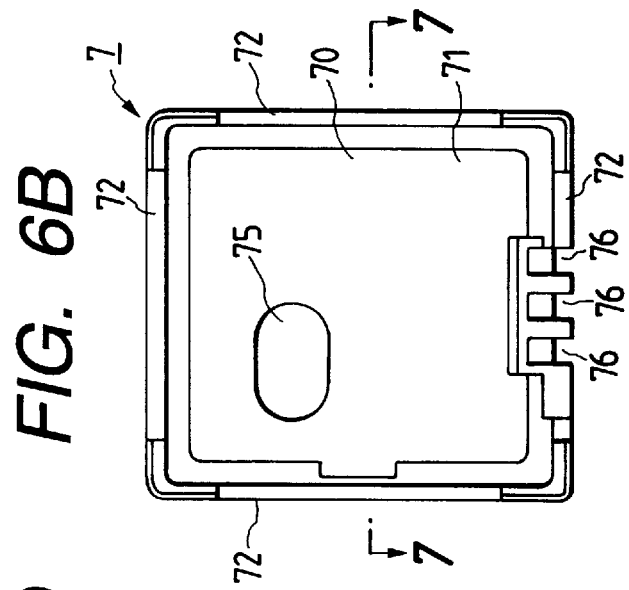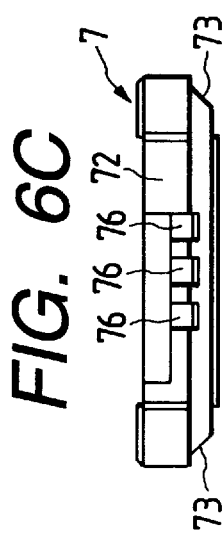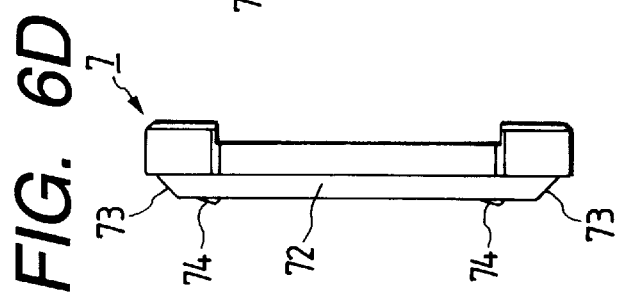

OSCILLATION TYPE GYROSCOPE

BACKGROUND OF THE INVENTION

1. Field of the Invention

The present invention relates to an oscillation type gyroscope to be used, for example, as an angular velocity sensor in an automobile navigation system.

2. Description of the Related Art

The oscillation type gyroscope utilizes a dynamic phenomenon such that when a rotational angular velocity is imparted to an oscillating object, there occurs Coriolis' force in a direction orthogonal to the oscillating direction. In the oscillation type gyroscope, electrodes are formed on one or plural faces of an oscillator, then an AC voltage is applied to those electrodes from the exterior, and a detection output based on a piezoelectric effect is taken out. However, the oscillator is connected directly to a circuit board.

FIG. 19 is a perspective view of an oscillator used in a conventional oscillation type gyroscope.

In FIG. 19, the numeral 401 denotes a piezoelectric oscillator, numeral 402 denotes one side of the piezoelectric oscillator, numerals 403, 404, 405, 406, 407 and 408 denote band-like electrodes formed on one side 402, and numerals 403a, 408a and 409 denote land portions.

SUMMARY OF THE INVENTION

According to the above prior art, however, of the belt-like electrodes, those located on both sides, i.e., the electrodes 403 and 408 have respective connecting portions (land portions 403a and 408a) disposed at side edges of the oscillator 401. Therefore, when a large number of oscillators are to be obtained from a large piezoelectric substrate for the formation of oscillators, it is required that patterns for polarization be extended sideways from the land portions 403a and 408a, with consequent necessity of enlarging the space between adjacent oscillators and hence deterioration in yield of the piezoelectric substrate. Besides, when the oscillator 401 is connected directly to a circuit board as in the above prior art, it becomes easier for oscillation to transmit between the oscillator and the circuit board, thus giving rise to the drawback that a signal cannot be taken out accurately due to the action of undesired oscillations.

It is the first object of the present invention to provide an oscillation type gyroscope wherein an oscillator is not directly connected to a circuit board, but both are connected together through a flexible circuit board, so it is difficult for oscillation to propagate between the circuit board and the oscillator and it is possible to detect a more accurate signal, and wherein electrodes lying in the same plane and becoming equal in potential at the time of polarization and in use are gathered as one group, so the space between the portion to be connected to the flexible printed circuit board and the other electrodes can be taken wide, thus making it possible to prevent short-circuit and improve the working efficiency in soldering.

It is the second object of the present invention to provide an oscillation type gyroscope superior in the yield of a piezoelectric substrate and capable of being reduced in cost.

It is the third object of the present invention to provide an oscillation type gyroscope wherein the oscillation of a circuit board is difficult to propagate to an oscillator and the oscillation of the oscillator is also difficult to propagate to the circuit board.

It is the fourth object of the present invention to provide an oscillation type gyroscope wherein oscillation is more difficult to propagate between an oscillator and a circuit board.

It is the fifth object of the present invention to provide an oscillation type gyroscope wherein a single flexible printed circuit board is sufficient even if electrodes are formed on both sides of an oscillator.

It is the sixth object of the present invention to provide an oscillation type gyroscope wherein even when electrodes which become equal in potential in use are formed on both sides of an oscillator, the width of a wiring portion between the electrodes does not become large.

It is the seventh object of the present invention to provide an oscillation type gyroscope wherein even if electrodes and connecting portions are present each in a plural number, they can be connected in a single operation to one side of an oscillator.

It is the eighth object of the present invention to provide an oscillation type gyroscope wherein a thermowelded portion between an electrode and a connecting portion is difficult to break even with an undesired force exerted thereon.

The above first object is attained by a first means comprising: an oscillator having electrodes for driving and for detection formed on both the surface and the back surface of the oscillator and also having oscillating arms adapted to oscillate in a cantilevered state, with front end portions of the oscillating arms being free ends; a support member for supporting a base end portion of the oscillator; a circuit board to which the support member is secured; a flexible printed circuit board with wiring patterns formed thereon and having at least an oscillator-side end portion, a circuit board-side end portion and a wiring portion positioned between the oscillator-side end portion and the circuit board-side end portion; first connecting portions provided in the oscillator-side end portion of the flexible printed circuit board, conducted with the wiring patterns and connected to corresponding electrodes among the electrodes electrically by soldering at the base end portion of the oscillator; and a second connecting portion provided in the circuit board-side end portion of the flexible printed circuit board, conducted with the wiring patterns and connected electrically to the circuit board at the circuit board-side end portion, wherein, among the electrodes of the oscillator, those which lie in the same plane and which become equal in potential at the time of polarization and in use, are gathered as one group at the base end portion of the oscillator.

The above second object is attained by a second means, in combination with the first means, wherein among the electrodes, those used for polarization are all extended up to an end portion on the base end side opposite to the front end side of the oscillator.

The above third object is attained by a third means, in combination with the first means, wherein the wiring portion of the flexible printed circuit board is smaller in width than the oscillator-side end portion and the circuit board-side end portion.

The above fourth object is attained by a fourth means, in combination with the third means, wherein among the electrodes, at least as to those adjacent to each other and becoming equal in potential in use, the corresponding first connecting portions are connected with each other in the oscillator-side end portion, and a wiring pattern conducted with those first connecting portions is formed as a common wiring pattern in the wiring portion.

The above fifth object is attained by a fifth means, in combination with the fourth means, wherein the flexible printed circuit board is provided with two branch portions resulting from branching of the wiring portion on the oscillator side with respect to a central side and is also provided with two such oscillator-side end portions as mentioned above one of which is for the surface of the oscillator and the other of which is for the back surface of the oscillator, and the first connecting portions are formed at the oscillator-side end portions and are connected to corresponding electrodes formed on both sides of the oscillator.

The above sixth object is attained by a six means, in combination with the fifth means, wherein the wiring patterns conducted respectively with the electrodes which become equal in potential at both the surface and the back surface of the oscillator are gathered in the branch portions and are extended up to the circuit board-side end portion.

The above seventh object is attained by a seventh means, in combination with the fifth means, wherein the electrodes of the oscillator are formed by printing of a paste consisting mainly of silver, and cream solder or tin-lead plating is applied to the first connecting portions formed in the oscillator-side end portions of the flexible printed circuit board so that the solder is melted by thermowelding to connect the electrodes and the first connecting portions in the oscillator-side end portions with each other.

The eighth object is attained by an eighth means, in combination with the seventh means, wherein an adhesive is applied to the thermowelded connections between the electrodes and the first connecting portions in the oscillator-side end portions.

BRIEF DESCRIPTION OF THE DRAWINGS

FIG. 1 is a side view of an oscillation type gyroscope according to the first embodiment of the present invention;

FIGS. 2A, 2B, 2C, 2D and 2E are a plan view, a front view, a bottom view, a right side view and a rear view, respectively, of the oscillation type gyroscope;

FIGS. 3A and 3B are respectively a vertical sectional view of the oscillation type gyroscope as seen through a shield cover and a rear view thereof with a lid removed;

FIGS. 6A, 6B, 6C, 6D and 6E are a plan view, a front view, a bottom view, a left side view and a rear view, respectively, of the lid;

DESCRIPTION OF THE PREFERRED EMBODIMENT

Figure 4A:
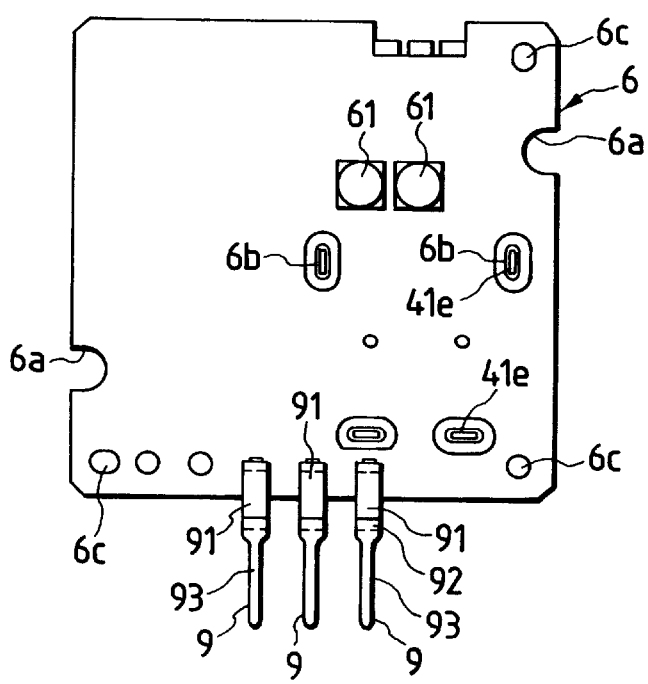
FIGS. 4A, 4B and 4C are a rear view, a left side view and a bottom view, respectively, with an oscillator secured to a substrate through a support member.

In FIG. 1, the reference numeral 100 denotes an oscillation type gyroscope which incorporates therein a three-leg tuning-fork oscillator 1 to be described later. For example, the oscillation type gyroscope 100 is secured and fixed to a mounting substrate 110 for a car navigation system.

The oscillator 1, which is a three-leg (or two-leg) tuning-fork type, is used as a sensor in a gyroscope which generates an oscillating component based on Coriolis' force in a rotational system.

Figure 5:
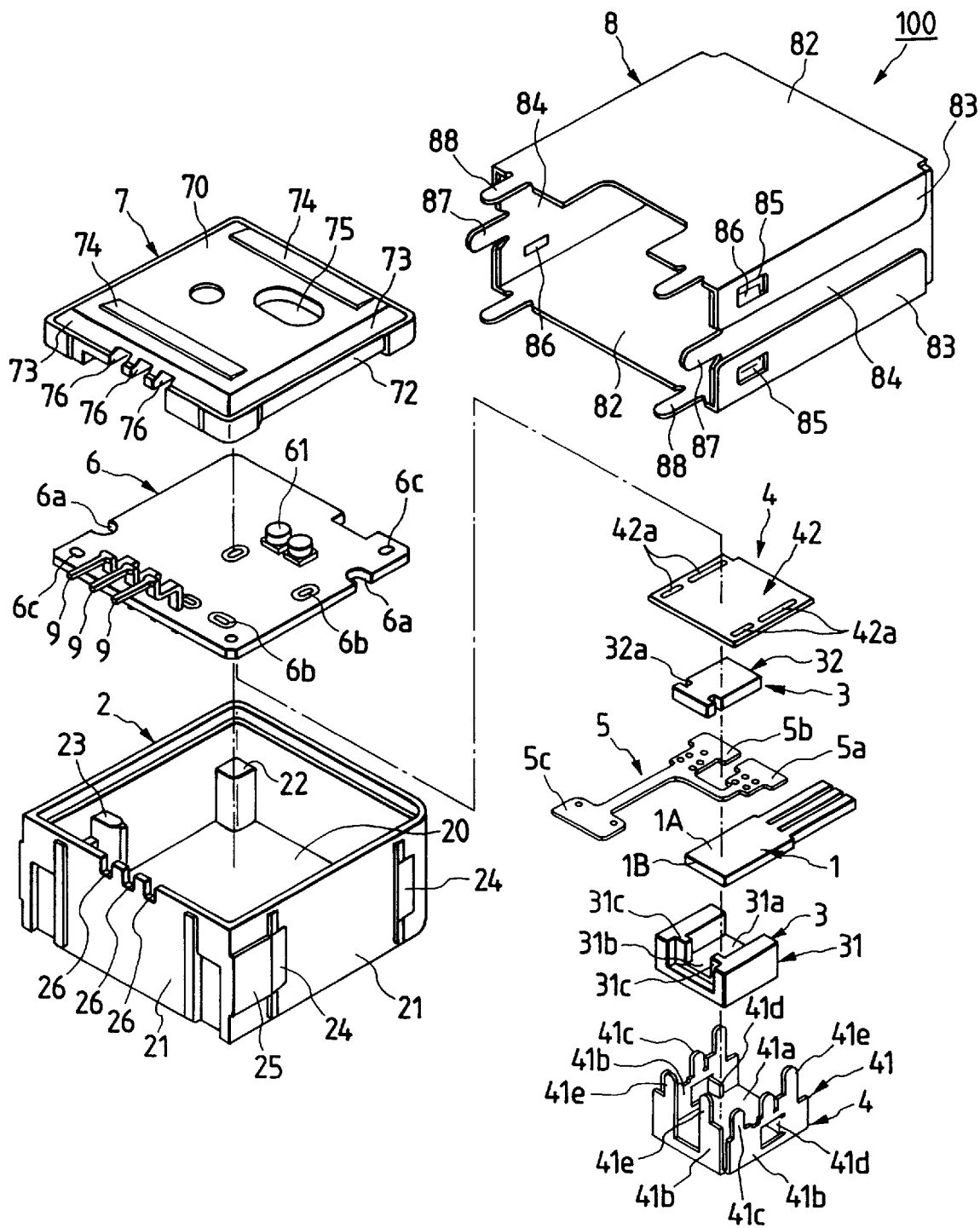
FIG. 5 is an exploded perspective view of the oscillation type gyroscope.

As shown in FIG. 5, the oscillation type gyroscope mainly comprises a case 2 having an upper opening, a support member 4 which is mounted by clamping a portion thereof located on a base end portion 1A side of the oscillator 1 with use of an oscillation insulating rubber 3, a flexible printed circuit board 5 fixed and connected by thermowelding to the base end portion 1A of the oscillator 1, a circuit board 6 to which is fixed the oscillator 1 in a mounted state to the support member 4, a lid 7 which covers the opening of the case 2 with the circuit board 6 received therein, and a shield cover 8 which is applied to the case 2 and the lid 7 both rendered integral with each other, to shield the outer surfaces of the case 2 and the lid 7.

The oscillator 1 is in the shape of a plate obtained by laminating a piezoelectric material serving as drive means and detector means to the surface of a constant-modulus material such as elinvar or in the shape of a plate formed wholly by the piezoelectric material. On the surface of the piezoelectric material are formed driving electrodes for driving oscillating arms and detecting electrodes for the detection of oscillation.

Figure 11:
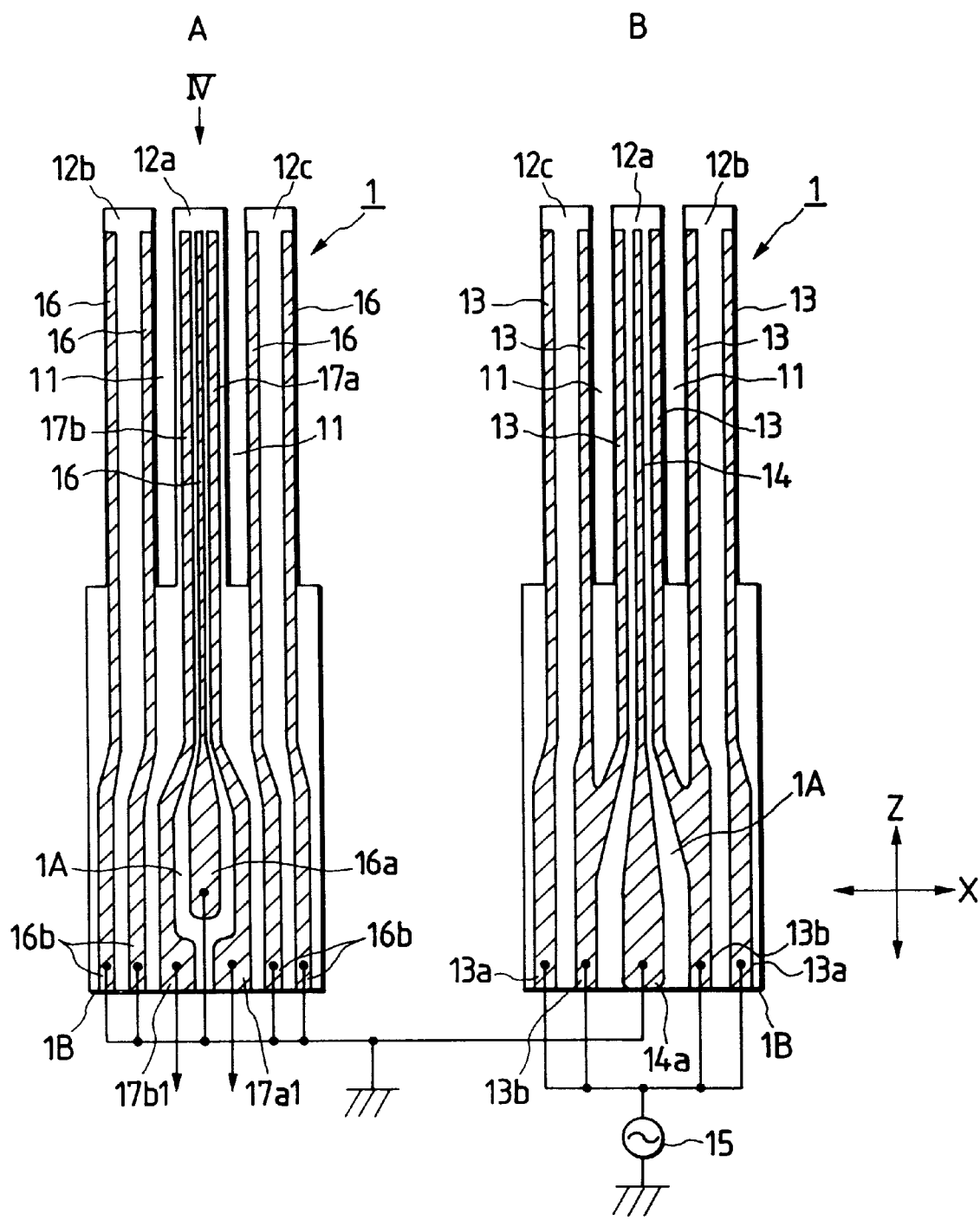
FIGS. 11A and 11B are explanatory views respectively of the oscillator as seen from the surface and of the oscillator as seen from the back, in a state of detection under operation of the oscillator.

In this embodiment, the oscillator 1 is formed using a piezoelectric material, for example, a piezoelectric ceramic material such as PZT (lead titanate zirconate) in the form of a plate. As shown in FIG. 11, a front end portion extending from the base end portion 1A is divided by slots 11, 11 into three integral oscillating arms 12a, 12b and 12c. Dielectric polarization directions of the piezoelectric material in the oscillating arms 12a, 12b and 12c are as indicated with arrows in FIG. 12. The oscillating arms 12b and 12c located on both right and left sides are the same in the direction of dielectric polarization, while the oscillating arm 12a located at the center is symmetric in the direction of dielectric polarization with the right and left oscillating arms 12b, 12c on the right, left and upper, lower sides.

On the lower surface (back) side of each of the oscillating arms 12a, 12b and 12c are formed a pair of driving electrodes 13, 13 using an electrically conductive material. As shown in FIG. 11B, the driving electrodes 13, 13 extend up to an end face 1B of the oscillator 1, with land portions 13a and 13b being formed in the base end portion 1A. The land portion 13b is connected to two driving electrodes 13, 13 to each of which is applied a voltage of the same potential. The driving electrodes 13, 13 are connected to a driving AC power supply 15 through conductive paths. To each of the driving electrodes 13, 13 is applied a driving voltage of the same potential from the AC power supply 15. One ground electrode 14 is formed on the back of the central oscillating arm 12a. The ground electrode 14 extends up to the end face 1B of the oscillator 1 and with a land portion 14a being formed in the base end portion 1A of the oscillator. The ground electrode 14 is at the ground potential through a wiring path. The two driving electrodes 13, 13 with a voltage of the same potential applied to each of them are gathered to a single land portion 13b at their one end portions, whereby the number of land portions formed can be reduced. The area of the land portion, as well as that of land portions to be described later, can be set large and hence it is possible to improve the working efficiency in the soldering work for example.

On an upper surface (the surface) of the oscillator 1, a pair of ground electrodes 16, 16 are formed on each of the right and left oscillating arms 12b, 12c, a pair of detecting electrodes 17a, 17b are formed on the central oscillating arm 12a, and one ground electrode 16 is formed between the paired detecting electrodes 17a and 17b of the central oscillating arm 12a. As shown in FIG. 11A, a total of four ground electrodes 16, 16 formed on the oscillating arms 12b and 12c extend up to the end face 1B of the base end portion 1A of the oscillator 1 and with respective land portions 16b at the base end portion 1A. The ground electrode 16 formed on the central oscillating arm 12a extends up to a position just before the end face 1B of the oscillator 1 and with a land portion 16a being formed at the base end portion 1A. The ground electrodes 16 are at the ground potential through wiring paths. The driving electrodes 13, ground electrodes 14, 16 and detecting electrodes 17a, 17b are formed by printing a silver-based paste such as a silver paste or a mixed silver-palladium paste. In this embodiment there is used a silver paste not containing palladium which is expensive. The printing is followed by baking to evaporate a solvent used for solving silver powder and binder material, thereby affording electrode patterns. The land portions 13a, 13b and 14a are formed by printing simultaneously with the formation of the driving electrodes 13 and ground electrodes 14. Likewise, the landportions 16a, 16b, 17a1 and 17b1, (17a1 and 17b1 will be described later), are formed by printing simultaneously with the formation of the ground electrodes 16 and detecting electrodes 17a, 17b.

With the driving electrodes 13, and the ground electrodes 14, 16, a driving voltage is applied to the piezoelectric material as drive means. In accordance with the dielectric polarization structure shown in FIG. 12, the right and left oscillating arms 12b, 12c are oscillated in X direction at the same phase, and the central oscillating arm 12a is also oscillated in X direction at a phase (180° phase shift) reverse to that of the right and left oscillating arms 12b, 12c. That is, at a certain time point, the amplitude of the right and left oscillating arms 12b, 12c in X direction and that of the oscillating arm 12a in the same direction are opposite to each other. If the ground electrodes 14 and 16 are not connected to ground, the oscillating arms 12a, 12b and 12c will not be oscillated, and thus the ground electrodes 14 and 16 also function as driving electrodes.

On an upper surface of the central oscillating arm 12a are formed a pair of detecting electrodes 17a and 17b, which extend up to the position of the end face 1B on the base end side of the oscillator 1. Land portions 17a1 and 17b1 are integral with the detecting electrodes 17a and 17b, respectively. Since the land portion 16a of the central ground electrode 16 does not reach the end face 1B of the base end portion 1A of the oscillator 1, the land portions 17a1 and 17b1 are formed widely in the base end portion 1A.

In FIG. 11, the driving electrodes 13 formed on the oscillator 1 are brought into conduction with conductive patterns (circuit patterns) on the circuit board 6 through the flexible printed circuit board 5 (not shown), and through the conductive patterns they are conducted with the driving AC power supply 15 shown in FIG. 11. The ground electrodes 14, 16 and the detecting electrodes 17a, 17b are also conducted with predetermined conductive patterns on the circuit board 6 through the flexible printed circuit board 5. The flexible printed circuit board 5 is bifurcated on one end side thereof into an oscillator surface-side connecting end portion 5a and an oscillator back-side connecting end portion 5b, which end portions 5a and 5b are thermowelded respectively to the surface- and back-side land portions of the oscillator 1. On the opposite end side of the flexible printed circuit board 5 is formed a circuit board connecting end portion 5c which is connected to conductive patterns (not shown) on the circuit board 6. As to the construction and connection of the flexible printed circuit board 5, the details thereof will be described later.

Besides, since the oscillator 1 is supported by a single support member 4, the number of a fixing component for the oscillator can be reduced to a minimum. Moreover, since the base end portion 1A of the oscillator 1 is supported by the support member 4, the oscillator is supported stably by the support member 4. Further, since the oscillator 1 is mounted onto the circuit board 6 through the oscillation insulating rubber 3 of the support member 4, external impacts and oscillations imposed on the circuit board 6 can be buffered by the oscillation insulating rubber 3 and hence prevented from being propagated directly to the oscillator 1.

Particularly, in the three-leg tuning-fork oscillator 1 shown in figures, since the right and left oscillating arms 12b, 12c and the central oscillatingarm 12a oscillate at a 180° phase shift, a good oscillation balance is ensured throughout the oscillator 1, and even if there occurs oscillation at the base end portion 1A of the oscillator 1, the oscillation will be very small. Thus, in the supported state of the base end portion 1A by the support member 4, the oscillating arms 12a, 12b and 12c can oscillate without being restrained by such supported state, with no fear of deterioration in both driving ability and detecting sensitivity of the oscillating arms.

Given that the mass of each oscillating arm is m, an oscillation velocity in X axis direction of the oscillating arm is v (vector value), and an angular velocity about Z axis in a rotational system is $\omega 0$ (vector value), Coriolis' force F (vector value) is represented as follows:

F=2m (v x $\omega 0$) (x stands for a vector product)

The Coriolis' force is proportional to the angular velocity $\omega$ 0. Thus, a deformed oscillation of the oscillating arm 12a in Y axis direction is detected by the detecting electrodes, whereby the angular velocity $\omega 0$ is determined.

When the oscillator 1 is placed in a rotational system having an angular velocity about Z axis, the oscillating arms 12a, 12b and 12c each have an oscillating component in Y direction under the action of the Coriolis' force shown in the above equation. The oscillating arms 12b and 12c located on both sides and the central oscillating arm 12a are opposite to each other in drive phase at the driving voltage, so also as to the phase of oscillation induced by Coriolis' force, the oscillating arms 12b, 12c and the oscillating arm 12a are opposite to each other. More specifically, at a certain time point, the oscillating arms 12b and 12c are the same in amplitude direction on Y axis based on Coriolis' force, and the amplitude direction on Y axis of the central oscillating arm 12a is opposite to that of the oscillating arms 12b and 12c.

The detecting electrodes 17a and 17b are formed on the same face of the central oscillating arm 12a, and the piezoelectric material of the central oscillating arm 12a functions as a Coriolis' force detecting means. The portions of the piezoelectric material where the detecting electrodes 17a and 17b are formed are opposite to each other in the direction of dielectric polarization, so that with respect to the oscillating component in Y direction based on Coriolis' force, the detecting electrodes 17a and 17b afford piezoelectric detection outputs of 180° phase shift. By taking a difference between the detection outputs of both detecting electrodes 17a and 17b, the absolute values of the detection outputs are added. By the detection output thus obtained it becomes possible to calculate an angular velocity ω component about Z axis.

Figure 4B:
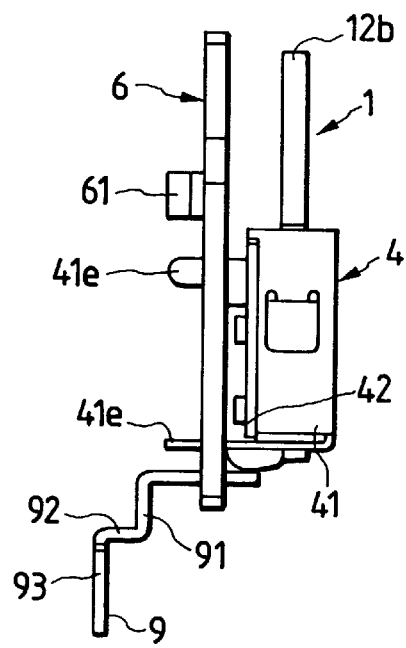
Figure 4C:
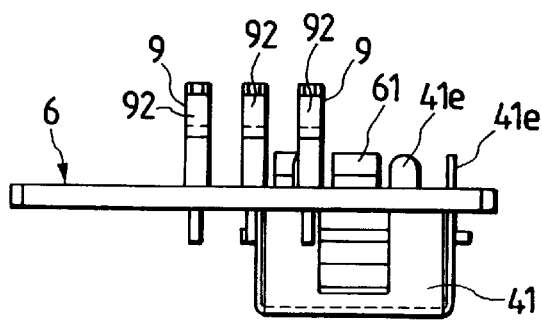

As shown in FIGS. 3, 4 and 5, the base end portion 1A of the oscillator 1 is supported by the support member 4 while being clamped by the oscillation insulating rubber 3. The support member 4, as shown in FIG. 5, comprises a support member case 41 with the oscillation insulating rubber 3 received therein and a support member lid 42 fixed to the case 41. The support member case 41 is formed by bending a phosphor bronze plate of 0.3 mm thick and, as shown in FIG. 5, it comprises a flat, square plate-like bottom portion 41a, side plate portions 41b, 41b, 41b formed by bending on three sides of the bottom plate portion 41a, fixing pieces 41c for the support member lid 42, the fixing pieces 41c being projected from the upper ends of opposed side plate portions 41b, 41b, positioning pieces 41d for the oscillation insulating rubber 3, the positioning pieces 41d being raised inwards from opposed side plate portions 41b, 41b, and legs 41e for mounting to the circuit board 6, the legs 41e being projected from the upper end of the side plate portions 41b. In the support member lid 42 formed by a 0.5 mm thick, flat, phosphor bronze plate there are formed slits 42a for insertion therethrough of the fixing pieces 41c and legs 41e.

The oscillation insulating rubber 3 is formed using a silicone rubber which undergoes little thermal change in hardness, and it comprises first and second oscillation insulating rubber members 31, 32. As shown in FIG. 5, the first oscillation insulating rubber member 31 has a recess 31a for fitting therein of the base end portion 1A of the oscillator 1, a cutout portion 31b for drawing out the flexible printed circuit board 5 thermowelded to the base end portion 1A of the oscillator 1, and a pair of wall portions 31c, 31c which constitute the cutout portion 31b. The second oscillation insulating rubber member 32, which is in the shape of a rectangular plate, has cutout portions 32a, 32a formed in both side positions for fitting therein of the wall portions 31c, 31c of the first oscillation insulating rubber member 31.

The first oscillation insulating rubber member 31 is fitted in the support member case 41. The oscillator 1 with the flexible printed circuit board 5 thermowelded to the base end portion 1A thereof is fitted at the base end portion 1A into the recess 31a of the first oscillation insulating rubber 31. Then, the cutout portions 32a, 32a of the second oscillation insulating rubber member 32 are fitted on the wall portions 31c, 31c of the first oscillation insulating rubber member 31 in a sandwiching relation to the base end portion 1A of the oscillator 1. Further, the support member lid 42 is applied to the thus-assembled body and the fixing pieces 41c projected from the slits 42a are bent, whereby the support member 4 is secured to the oscillator 1. In this case, the oscillation insulating rubber 3 is set at a percent compression of 10~30%, and the base end portion 1A of the oscillator 1 is clamped between the first and second oscillation insulating members 31, 32 by means of the support member 4.

The legs 41e of the support member 4 are inserted into slits (apertures 6b) formed in the circuit board 6 and are soldered on the back side, whereby the oscillator 1 is secured to the circuit board 6 through the oscillation insulating rubber 3 by means of the support member 4, as shown in FIG. 4. The oscillation type gyroscope of this embodiment is used in a state wherein the base end portion 1A of the oscillator 1 is positioned down, while the oscillating arms 12a, 12b and 12c are positioned up.

Figure 10:
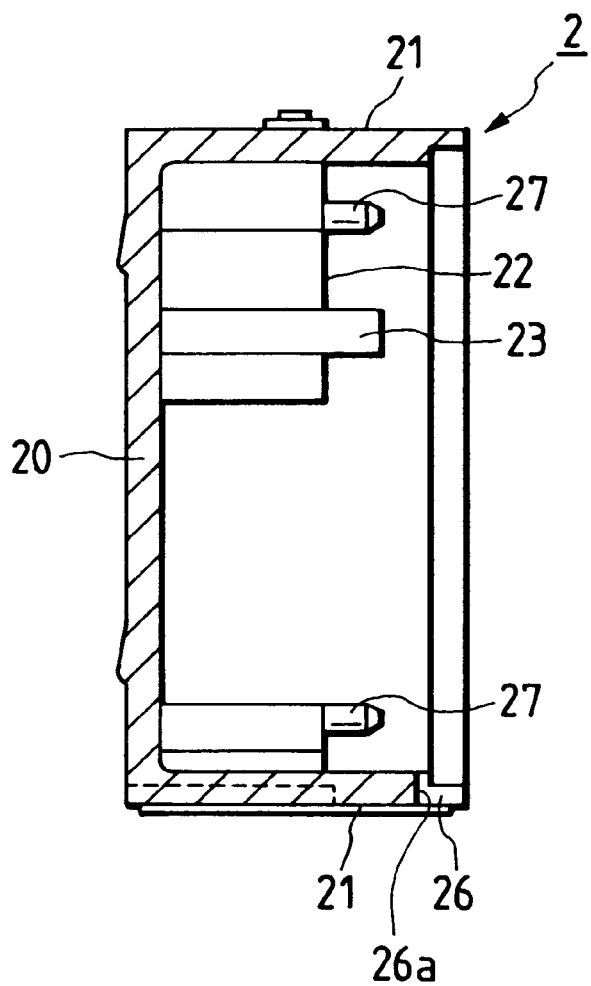
FIG. 10 is a sectional view taken on line 10—10 in FIG. 9D.

The case 2 is formed in the shape of a square box having an upper opening by molding a synthetic resin and it is provided with a square bottom 20, side walls 21 formed on the four sides of the bottom 20, height determining step portions 22 formed on the inner surfaces of the side walls 21 to determine the height of the circuit board 6, fixing ribs 23 to be fitted in cutout portions 6a of the circuit board 6 to position the same board and whose projecting portions are heat-caulked to fix the circuit board 6, tapered portions 24, 24, formed on the outer surfaces of opposed side walls 21, 21 and serving as guides when the shield cover 8 is fitted on the case 2, stepped convex portions 25 contiguous to the tapered portions 24 and serving as receiving portions when anti-dislodgment pawls 87 of the shield cover 8 are bent, cutout portions 26 for drawing out terminals 9 of the circuit board 6 to the exterior of the case 2, guide pins 27 for positioning the circuit board 6, and tapered portions 28 formed on the outer surface of the bottom 20 and serving as guides when the shield cover 8 is fitted on the case 2. The cutout portions 26 are each provided with a flat bottom 26a, as shown in FIG. 10.

As the material of the case 2 and the lid there may be used a synthetic resin material called engineering plastic such as PBT (polybutyrene terephthalate), PPS (polyphenylnene sulfide), or ABS (acrylonitrile-butadiene-styrene), with PBT being preferred from the standpoint of heat resistance and strength. The bottom of the case 2 may also be open, which opening may be closed with a bottom lid.

The circuit board 6 is a rigid board formed of a glass-contained epoxy resin for example, with a detector circuit (not shown) being mounted thereon. As shown in FIGS. 4 and 5, the circuit board 6 is provided with cutout portions 6a for fitting therein of the fixing ribs 23, insertion holes 6b for insertion therein of the mounting legs 41e of the support member case 41, guide holes 6c for insertion therein of the guide pins 27, and metallic terminals 9 connected and fixed to patterns which are connected to the detector circuit, etc. Numeral 61 denotes a pre-set variable resistor mounted on the circuit board 6. As shown in FIGS. 3 and 4, the terminals 9 each comprise a first horizontal plate portion 91 formed by bending so as to be substantially parallel to the surface of the circuit board 6, a first vertical plate portion 92 formed by bending approximately at right angles from the first horizontal plate portion 91, and a second horizontal plate portion 93 formed by bending approximately at right angles from the first vertical plate portion 92. Thus, as a whole, each terminal 9 is in a two-step shape.

Figure 7:
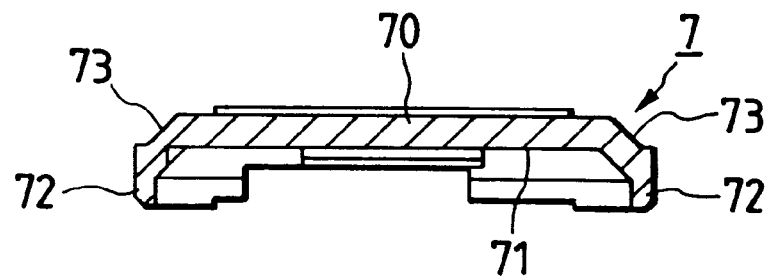
FIG. 7 is a sectional view taken on line 7—7 in FIG. 6B.
Figure 8:
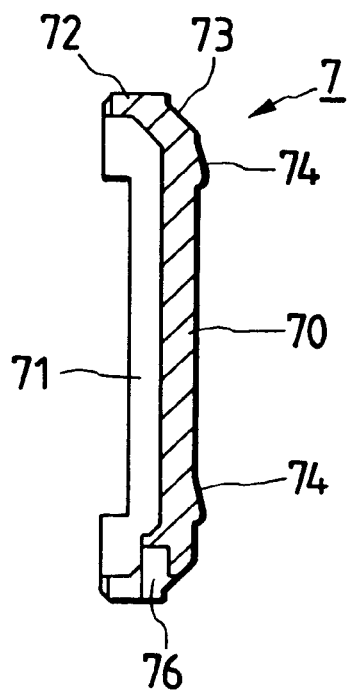
FIG. 8 is a sectional view taken on line 8—8 in FIG. 6E.
Figure 9:
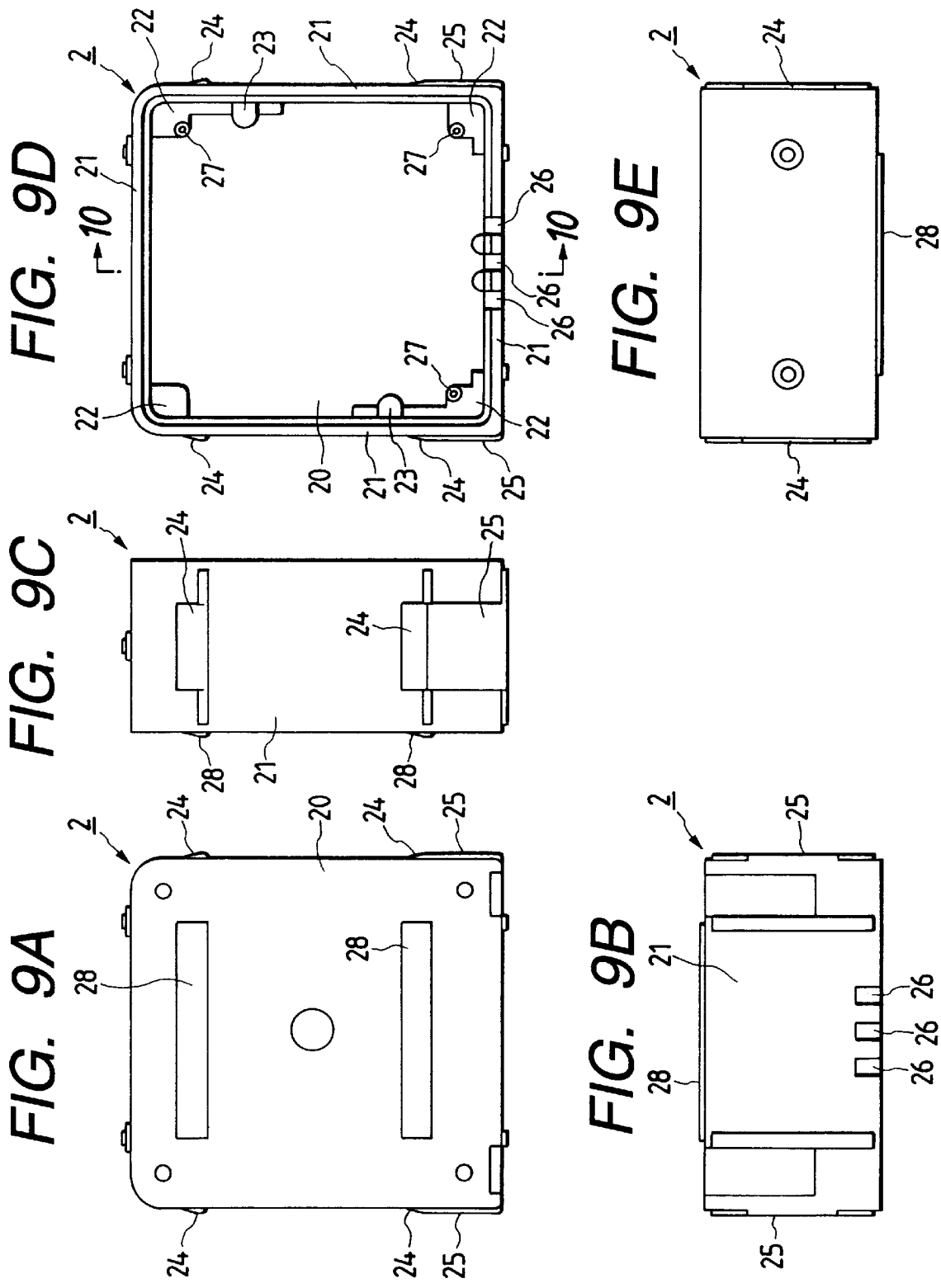
FIGS. 9A, 9B, 9C, 9D and 9E are a front view, a bottom view, a right side view, a rear view and a plan view, respectively, of a case.

The lid 7 is formed in the shape of a square plate as a whole so as to be positioned inside the side walls 21 and close the opening of the case. As shown in FIGS. 6 to 8, the lid 7 comprises a recess (inner bottom) 71 formed concavely on a lower surface (case) side of a flat plate portion 70, side portions 72 formed so as to surround the recess 71, inclined surface portions 73 formed along the peripheral edge of the upper surface side of the flat plate portion 70, tapered portions 74 projected on the upper surface side of the flat plate portion 70 and serving as guides when the shield cover 8 is fitted on the case, a through hole 75 serving as a vent hole for the air present in the interior of the case 2 at the time of heat-bonding the lid 7 and the case 2 with each other, and cutout portions 76 formed in the side portions 72 for drawing out the terminals 9.

The lid 7 is in the shape of an inverted tray as a whole and, as shown in FIG. 3, when the lid 7 is fitted on the case 2 so as to close the opening of the case, grooves G are formed along the peripheral edge of the lid (bonded portion of the lid and the case) by both the inclined surface portions 73 of the lid and the upper end portions of the side walls 21 of the case. The grooves G permits an adhesive S (hatched areas in FIG. 3) to be filled into only the bonded portion of the lid 7 and the case 2. Tips of four corners of the side portions 72 are in abutment against the circuit board 6 to prevent the lid 7 from dropping into the case 2.

The shield cover 8 is formed by bending a single metallic plate such as steel plate and, as shown in FIGS. 2 and 5, it comprises a rectangular topplate 81, a pair of first side plates 82 formed by bending at an obtuse angle from both long sides of the top plate 81, a pair of auxiliary side plates 83 formed by bending from both side edges of the first side plates 82, a pair of second side plates 84 formed by bending from both short sides of the top plate 81, retaining holes 85 formed respectively at positions close to the free ends of the auxiliary side plates 83, raised pawls 86 formed respectively at positions close to front ends of the second side plates 84 and are fitted in the retaining holes 85 in a snap-in fashion, anti-dislodgment pawls 87 formed at the front ends of the second side plates 84 to prevent dislodgment of the case 2, and fixing pawls 88 formed at front ends of the first side plates 82 to fix the shield cover to a mounting base 110.

By pushing in the first side plates 82, 82 which are in an expanded state beyond 90° relative to the top plate 81, the raised pawls 86 are fitted in the retaining holes 85 in a snap-in fashion, thus affording such a square box-shaped shield case 8 as shown in FIG. 5 for example.

Figure 13:
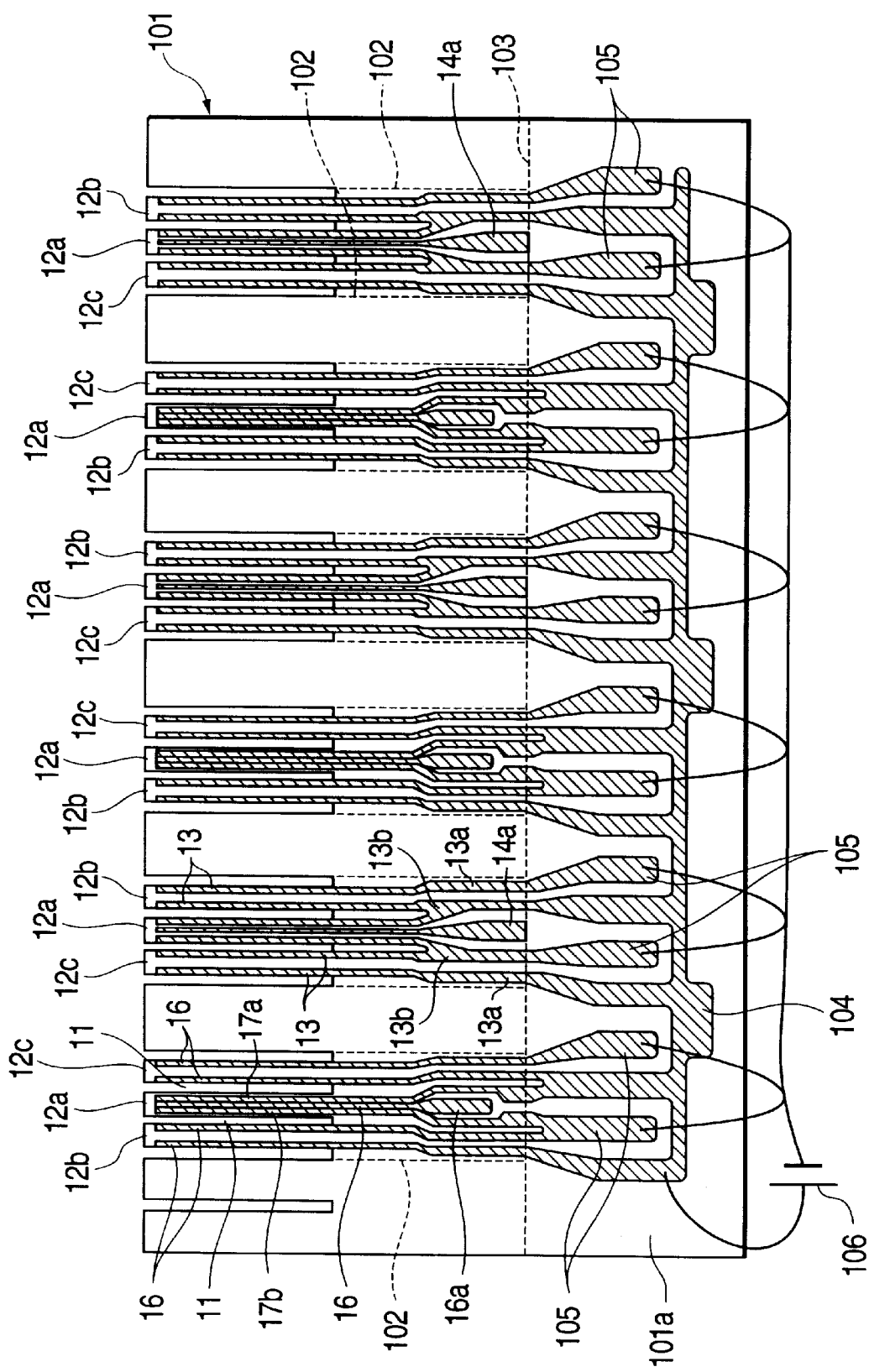
FIG. 13 is an explanatory view showing an oscillator manufacturing and polarizing method.

Now, with reference to FIG. 13, the following description is provided about a polarization treatment for the piezoelectric material which constitutes the oscillator 1.

Figure 12:
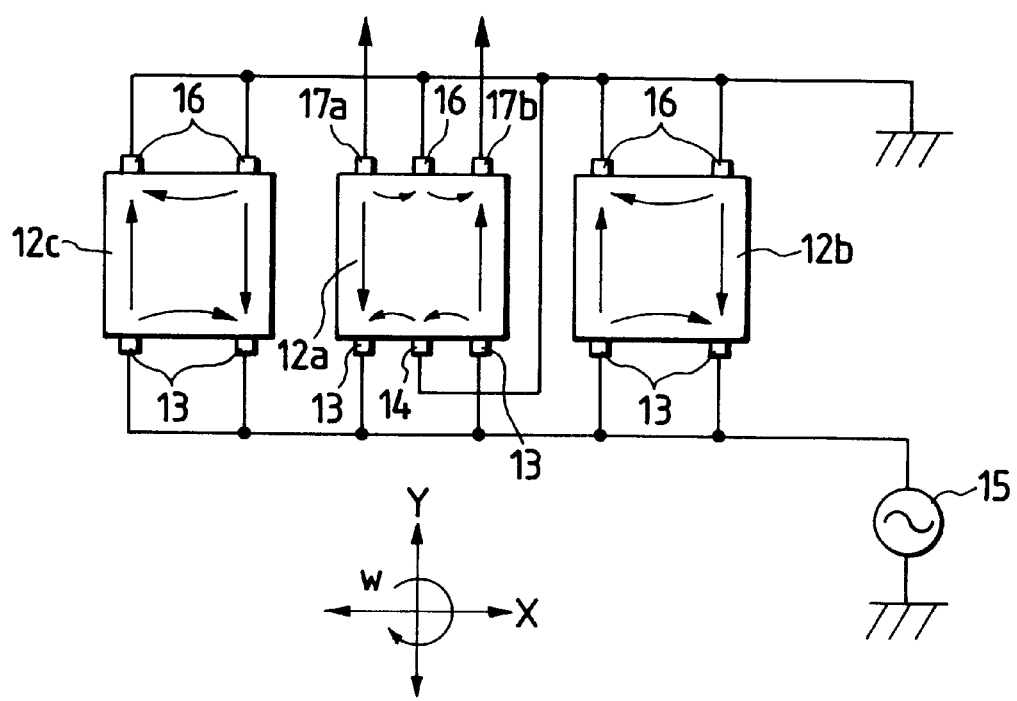
FIG. 12 is an explanatory view showing a dielectric polarization direction of the oscillator as seen in the arrow IV direction in FIG. 11.

The polarization treatment is for imparting such dielectric polarization directions as indicated with arrows in FIG. 12 to the ceramic material as the piezoelectric material and thereby allowing the ceramic material to exhibit a piezoelectric effect.

In this embodiment, six oscillators 1 (FIG. 11) are formed by cutting a single piezoelectric ceramic substrate 101 longitudinal partitioning dotted lines 102 of the oscillators and also along a dotted line 103 serving as an end face 1B of each oscillator. In this case, the oscillators 1 are arranged so that the surface and the back are alternate with each other, with polarizing patterns being formed in this state, thus permitting a large number of oscillators to be formed. Also on the back side of the piezoelectric ceramic substrate 101 shown in FIG. 13 there are formed corresponding polarizing patterns.

More specifically, in one side edge of the piezoelectric ceramic substrate 101 are formed three oscillating arms 12*b*, 12*a* and 12*c* on the surface side of the first oscillator from the leftmost end in FIG. 13, in a separate manner through slots 11, while on the right-hand side next to the oscillating arm 12*c* are formed three oscillating arms 12*c*, 12*a* and 12*b* on the back side of the second oscillator, through a predetermined space from the first oscillator. Likewise, on the right-hand side adjacent to the back of the second oscillator are formed three oscillating arms 12*b*, 12*a* and 12*c* on the surface side of the third oscillator, and on the right-hand side adjacent to the surface of the third oscillator are formed three oscillating arms 12*c*, 12*a* and 12*b* on the back side of the fourth oscillator. Thus, a total of six oscillators are formed in a surface-back alternating manner. On each oscillating arm 12*a* on the surface side, as noted previously, there are formed a pair of detecting electrodes 17*a*, 17*b* and one ground electrode 16 located between the detecting electrodes, and on each of the oscillating arms 12*b* and 12*c* are formed a pair of ground electrodes 16, 16. On each oscillating arm 12*a* on the back side, as mentioned previously, there are formed a pair of driving electrodes 13, 13 and one ground electrode 14 located between the driving electrodes, and on each of the oscillating arms 12*b* and 12*c* are formed a pair of driving electrodes 13, 13. Thus, on the back of the first oscillator counted from the left-hand side in FIG. 13 there are formed such driving electrodes 13 and ground electrode 14 as shown in FIG. 11B. On the surface (the back side in FIG. 13) of the second oscillator from the leftmost end in FIG. 13 there are formed such electrodes as shown in FIG. 11A. Also as to the other oscillators which follow, electrodes are formed in an alternate manner.

A further description will now be given with reference to the surface side, as an example, of the piezoelectric ceramic substrate 101 shown in FIG. 13. On the surface of the first oscillator from the leftmost end, the left-hand ground electrode 16 on the oscillating arm 12*b*, the right-hand detecting electrode 17*a* on the oscillating arm 12*a*, and the left-hand ground electrode 16 on the oscillating arm 12*c*, are each applied with a voltage of the same potential during polarization. Therefore, in a polarization pattern forming area 101*a* of the piezoelectric ceramic substrate 101 located below the cutting line 103, the detecting electrode 17*a* and ground electrodes 16 are gathered into a single common conductive pattern 104.

Likewise, on the back (the surface side in FIG. 13) of the second oscillator from the leftmost end, the left-hand driving electrode 13 on the oscillating arm 12*c*, the right-hand driving electrode 13 on the oscillating arm 12*a*, and the left-hand driving electrode 13 of the oscillating arm 12*b*, to each of which is applied a voltage of the same potential, are also connected to the common conductive pattern 104. Also as to the other oscillators, the oscillating arms of odd-numbered oscillators (on the side corresponding to the surface) are connected to the common conductive pattern 104 as is the case with the oscillating arms of the first oscillator, and the oscillating arms of even-numbered oscillators (on the side corresponding to the back) are connected to the common conductive pattern 104 as is the case with the oscillating arms of the second oscillator.

Further, the right-hand ground electrode 16 on the oscillating arm 12*b* of the first oscillator from the leftmost end and the left-hand detecting electrode 17 on the oscillating arm 12*a* of the same oscillator are connected to a single conductive pattern 105 extending independently in the polarization pattern forming area 101*a* of the piezoelectric ceramic substrate 101 so as not to be electrically connected with the common conductive pattern 104. The right-hand ground electrode 16 on the oscillating arm 12*c* is also connected to a single conductive pattern 105 extending independently in the polarization pattern forming area 101*a* of the piezoelectric ceramic substrate 101 so as to prevent its electrical connection with the common conductive pattern 104.

In the second oscillator from the leftmost end, whose back side is seen in the figure, the right-hand driving electrode 13 on the oscillating arm 12*c* and the left-hand driving electrode 13 on the oscillating arm 12*a* are connected to a single conductive pattern 105 extending independently in the polarization pattern forming area 101*a* of the piezoelectric ceramic substrate 101 so as not to be electrically connected with the common conductive pattern 104. The right-hand driving electrode 13 on the oscillating arm 12*b* of the second oscillator is also connected to a single conductive pattern 105 extending independently in the polarization pattern forming area 101*a* of the piezoelectric ceramic substrate 101 so as to prevent its electrical connection with the common conductive pattern 104.

Also as to the oscillating arms of the remaining four oscillators, those facing on the surface side are respectively connected to conductive patterns 105 independent of the common conductive pattern 104 as is the case with the first oscillator from the leftmost end, and the oscillating arms facing on the back side are respectively connected to conductive patterns 105 independent of the common conductive pattern 104 as is the case with the second oscillator from the leftmost end. Also on the back side of the piezoelectric ceramic substrate 101 in FIG. 13, the oscillating arms are connected respectively to conductive patterns 105 independent of the common conductive pattern 104.

The ground electrodes 14 and 16 on the oscillating arm 12*a* are not used for polarization nor are they connected to the common conductive pattern 104 or conductive patterns 105 because they are short as noted previously.

In this way there are formed six oscillators on the piezoelectric ceramic substrate 101. The common conductive pattern 104 with electrodes thus connected thereto is connected to positive side of the AC power supply 106, while the independent conductive patterns 105 with electrodes thus connected thereto, which patterns are twelve in all, are connected to the minus side of the AC power supply 106. The piezoelectric ceramic substrate 101 connected to the AC power supply 106 is immersed in silicone oil held at a temperature of 100° to 200° C. and is supplied with an AC voltage of 1 to 2 kV over a period of 1 to 3 hours by means of the AC power supply 106. In this way a polarization treatment is conducted, as shown in FIG. 12. After completion of the polarization treatment, the substrate 101 is cut along the cutting lines 102 and 103 to afford six such oscillators 1 as shown in FIG. 11.

Thus, in this embodiment, the land portions 13*a* and 16*a* of the driving electrodes 13 and ground electrodes 16 formed outside the oscillating arms 12*b* and 12*c* which are formed on both sides of each oscillator 1, reach the end face 1B, not a side edge, of the oscillator 1, thus permitting them to be extended as they are. Therefore, such a pattern as extending from a side edge of the base end portion 1A of the oscillator 1 is not needed. In other words, where a large number of oscillators are to be obtained from the piezoelectric ceramic substrate 101, the space between adjacent oscillators can be set narrow, that is, the manufacturing yield of the substrate 101 is high and the oscillators can be fabricated at a low cost.

Next, a detailed construction of the flexible printed circuit board 5, as well as a connective relation thereof to the oscillator 1, will be described below with reference to FIGS. 14 to 18.

Figure 14:
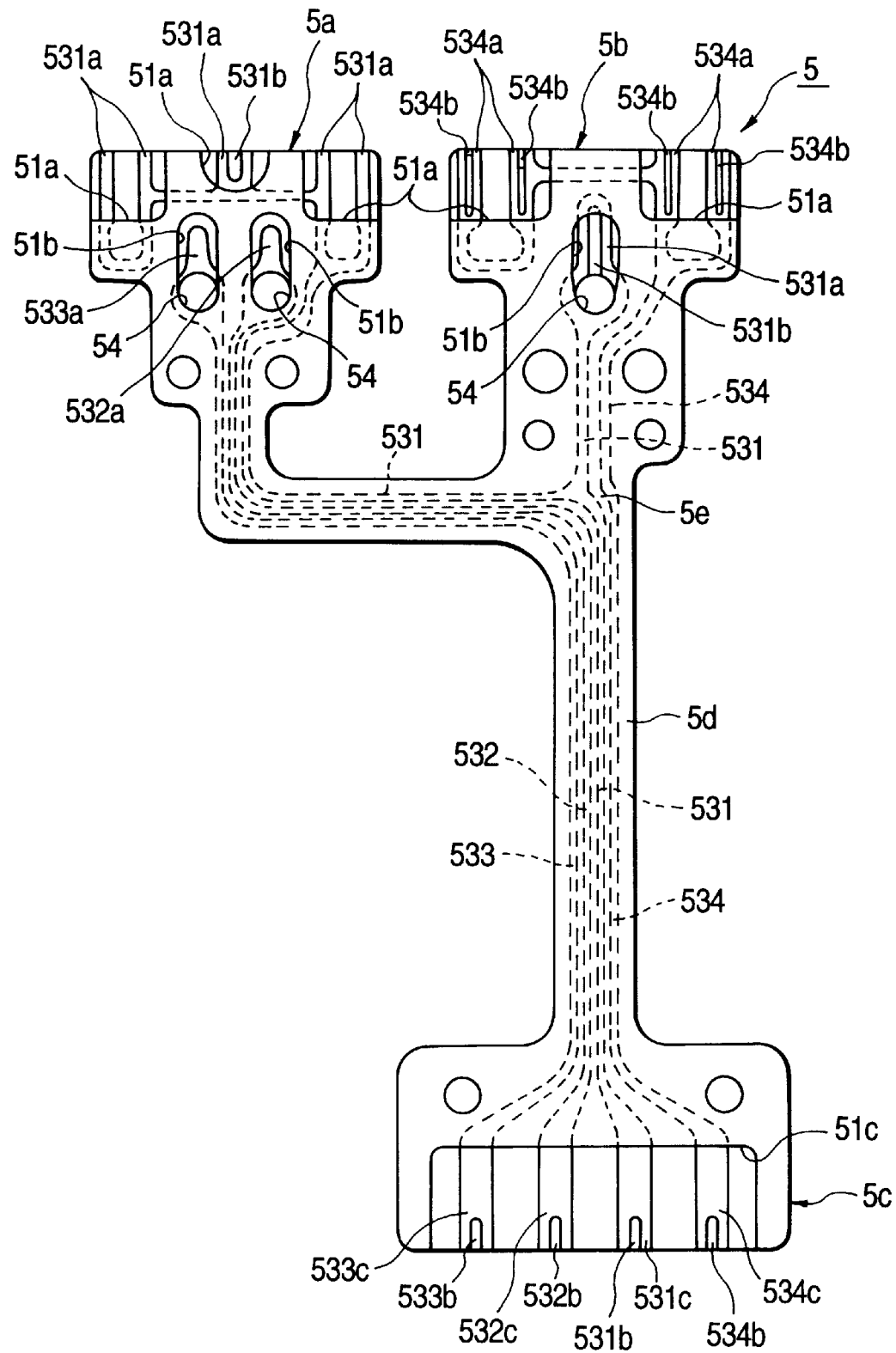
FIG. 14 is a plan view showing a flexible printed circuit board in detail.

The flexible printed circuit board 5 has a total plate thickness of about 50 μm and a width of 1 to 1.5 mm (at a wiring portion 5*d* between the oscillator and the circuit board). It may be a filmy board formed of a synthetic resin such as polyimide or polyethylene. In this embodiment there is used a polyimide resin in consideration of heat resistance. As noted previously and as shown in FIG. 14, the flexible printed circuit board 5 is provided at one end thereof with the oscillator surface-side connecting end portion 5*a* and the oscillator back-side connecting end portion 5*b* thermowelded respectively to the surface- and back-side land portions of the oscillator 1, while on the opposite end of the circuit board 5 is provided the circuit board connecting end portion 5*c* which is connected to conductive patterns (not shown) formed on the circuit board 6. The connecting end portions 5*a*, 5*b* and 5*c* are connected with one another through a band-like wiring portion 5*d*. In order to improve the oscillation balance of the oscillator 1, the wiring portion 5*d* is drawn out from central positions of the connecting end portions 5*a*, 5*b* and 5*c*. In the flexible printed circuit board 5, as shown in FIGS. 14 and 18B, wiring patterns 531, 532, 533 and 534 are integrally sandwiched in between films 51 and 52. To be more specific, wiring patterns 531, 532, 533, 534, which are formed by a metallic foil (copper foil), and land portions 531*a* and the like which are conductive with those wiring patterns, are formed simultaneously by etching on the film 52 serving as a base. Then, the film 51 (a cover film), which is used as a protective film for preventing, for example, short-circuit of the wiring patterns, is laminated onto the film 52 with use of an adhesive.

As shown in FIG. 14, on the oscillator surface-side connecting end portion 5*a* of the flexible printed circuit board 5 are formed land portions 531*a* of the wiring pattern 531 and land portions 532*a* and 533*a* of the two wiring patterns 532 and 533. The land portions 531*a*, 532*a* and 533*a* are exposed from cutout portions 51*a* or openings 51*b* formed in the film 51 so that they can be soldered.

Figure 15:
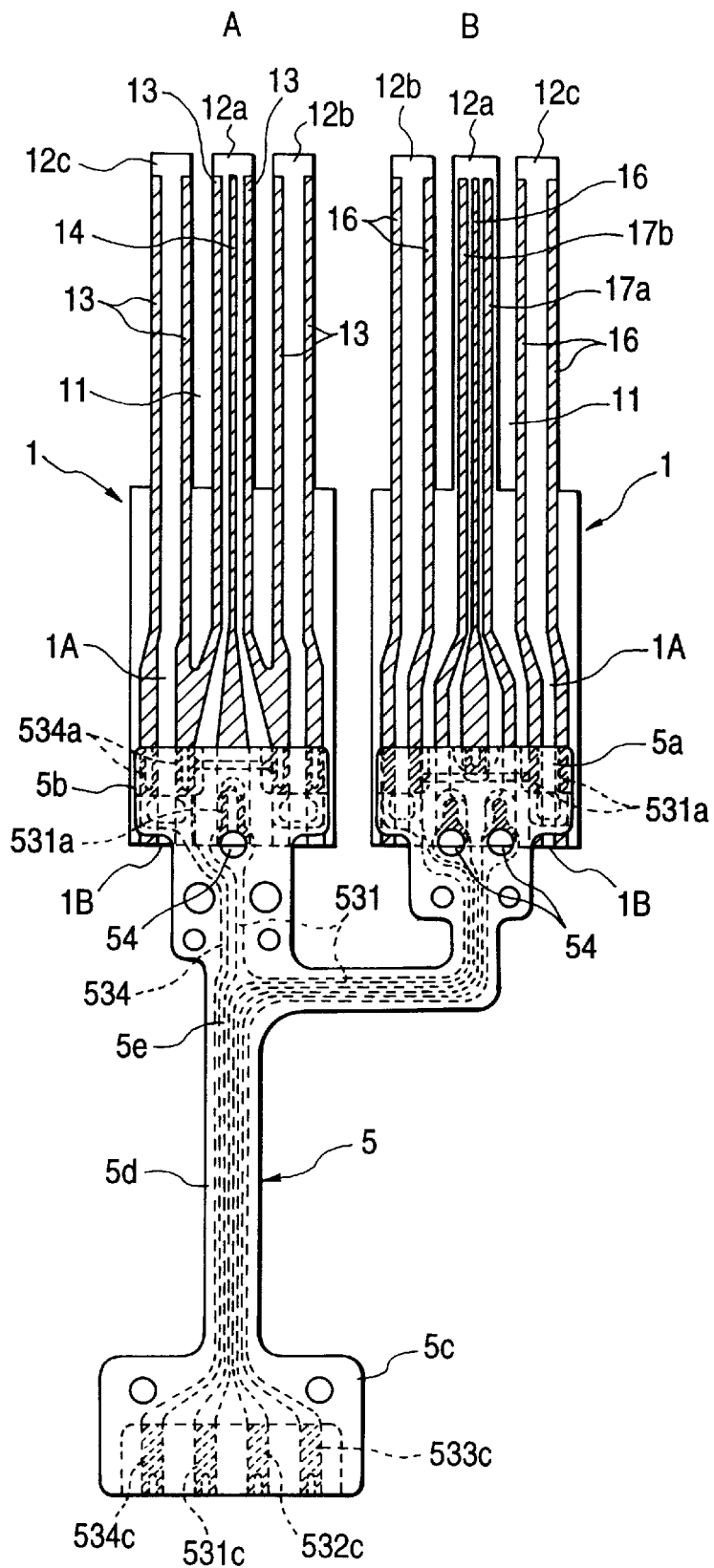
FIG. 15 is an explanatory view showing a state of connection between the oscillator and the flexible printed circuit board, the oscillator being seen from the back in A and from the surface in B.
Figure 16:
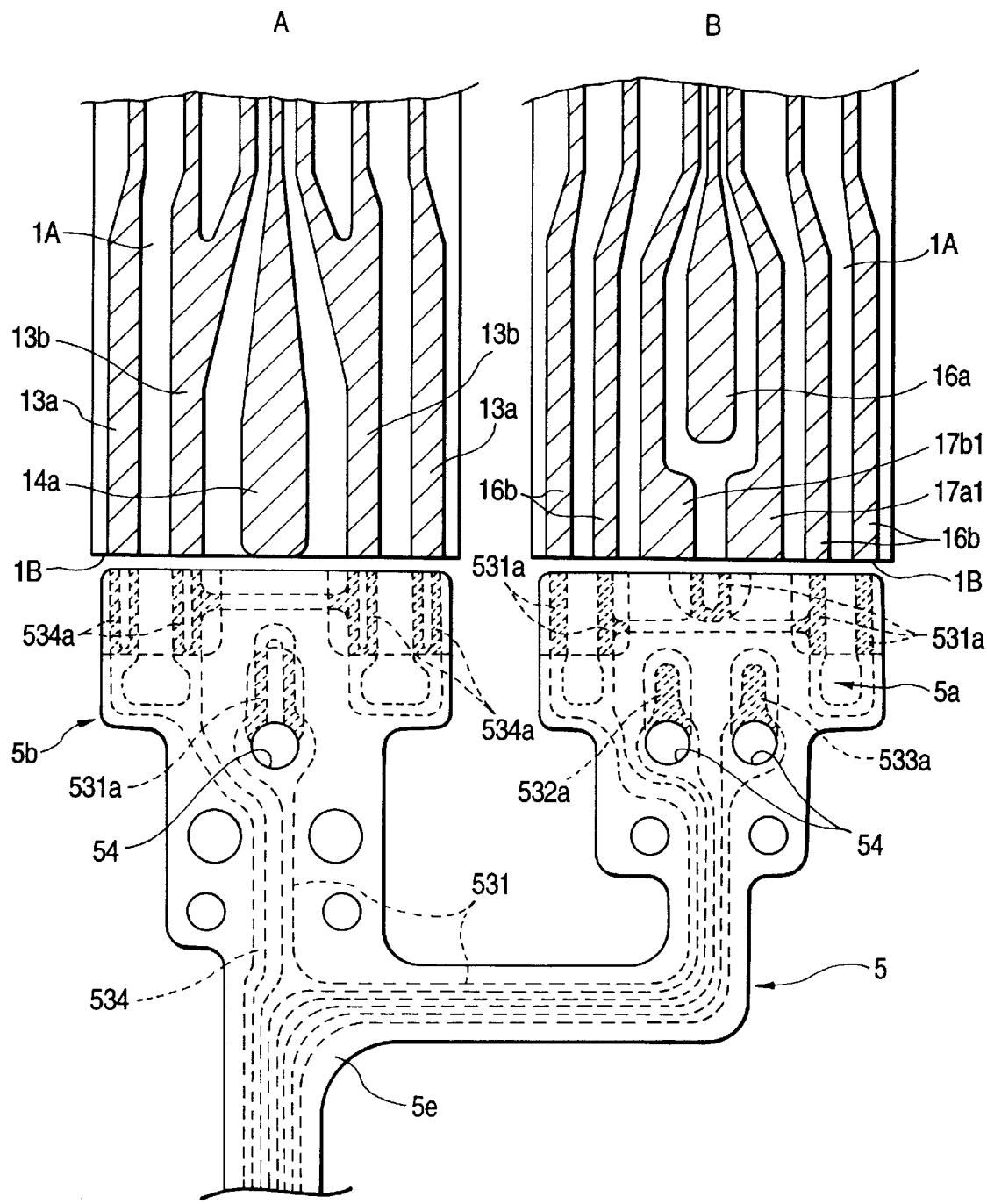
FIG. 16 is an enlarged plan view (explanatory view) showing the oscillator and the flexible printed circuit board in a separated state from each other to explain a correlation of the two in their connection, the oscillator being seen from the back in A and from the surface in B.
Figure 17:
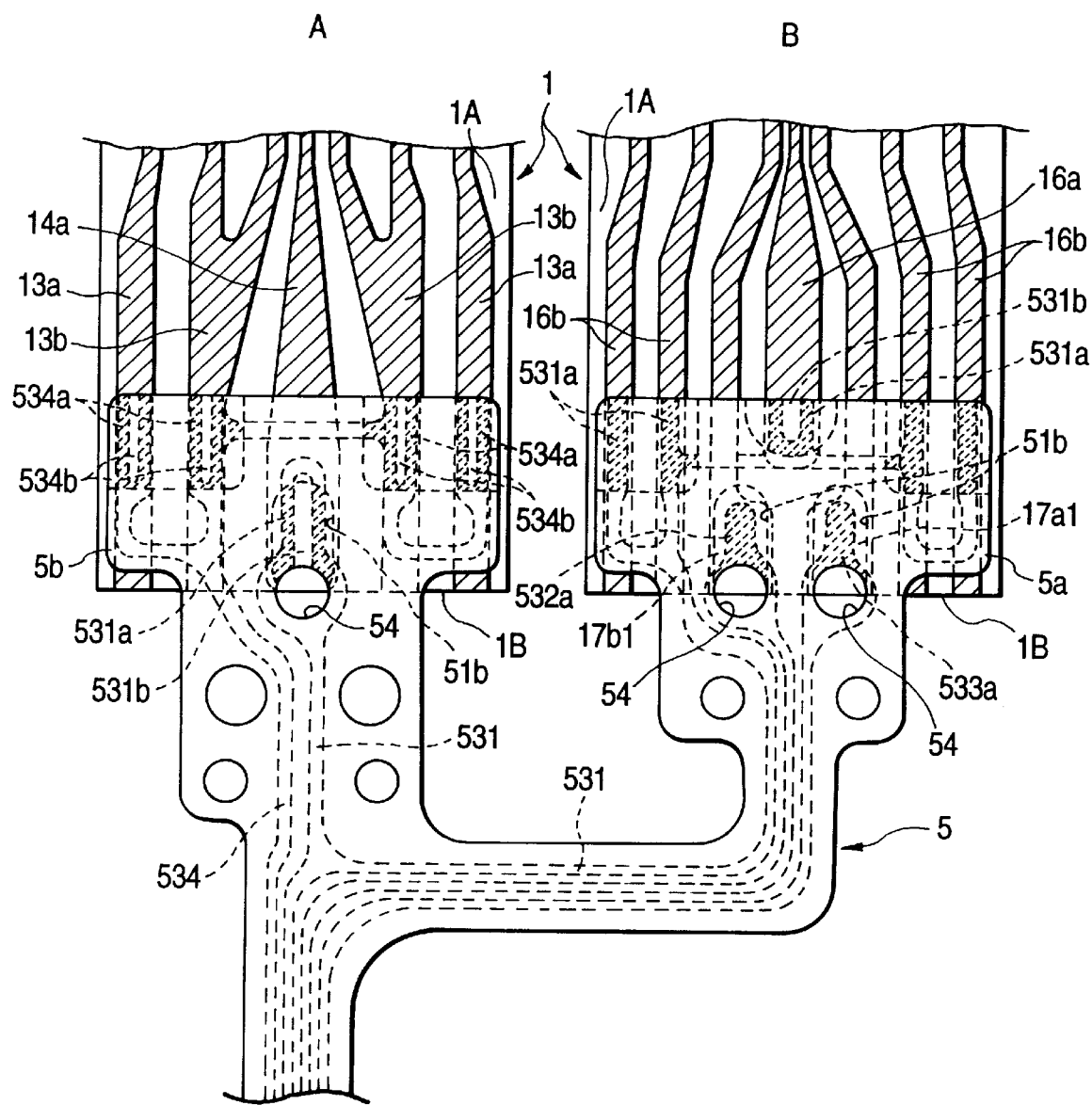
FIG. 17 is an enlarged plan view (explanatory view) showing the oscillator and the flexible printed circuit board in a connected state with each other, the oscillator being seen from the back in A and from the surface in B.

As shown in FIGS. 15 to 17, the land portions 531*a* of the oscillator surface-side connecting end portions 5*a* are connected to the land portions 16*b* of the two ground electrodes 16 on the oscillating arm 12*b*, the land portion 16*a* of the central ground electrode 16 on the oscillating arm 12*a* and the land portions 16*b* of the two ground electrodes 16 on the oscillating arm 12*c*. The land portions 532*a* and 533*a* of the wiring patterns 532 and 533 are connected to the land portions 17*b*1 and 17*a*1, respectively, of the two detecting electrodes 17*b* and 17*a* on the oscillating arm 12*a*. The land portions of electrodes which become equal in potential, i.e., the land portions 16*b* of the two ground electrodes 16 on the oscillating arm 12*b*, the land portion 16*a* of the central ground electrode 16 on the oscillating arm 12*a*, and the land portions 16*b* of the two ground electrodes 16 on the oscillating arm 12*c*, are connected together through a single continuous wiring pattern 531.

As shown in FIG. 14, in the oscillator back-side connecting end portion 5*b* of the flexible printed circuit board 5 is formed a single land portion 531*a* which is conductive with the four land portions 534*a* of the wiring pattern 534 and also with the wiring pattern 531. As shown in FIGS. 15 to 17, the land portions 534*a* of the oscillator back-side connecting end portion 5*b* are connected to the land portion 13*a* of the left-hand driving electrode 13 on the oscillating arm 12*c*, the land portion 13*b* common to both the right-hand driving electrode 13 on the oscillating arm 12*c* and the left-hand driving electrode 13 on the oscillating arm 12*a*, the land portion 13*b* common to both the right-hand driving electrode 13 on the oscillating arm 12*a* and the left-hand driving electrode 13 on the oscillating arm 12b, and the land portion 13a of the right-hand driving electrode 13 on the oscillating arm 12b. The land portion 531a of the wiring pattern 531 is connected to the land portion 14a of the central ground electrode 14 on the oscillating arm 12a. The wiring portion 5d is bifurcated at a branch portion 5e on the oscillator connecting end portions 5a and 5b side. The land portion 531a is connected to the associated wiring pattern 531 after branched at the branch portion 5e. These land portions 534a and 531a are also exposed from the cutout portions 51a or openings 51b formed in the film 51 and thus can be soldered. The land portions 531a and 534a correspond to connecting portions of the flexible printed circuit board 5.

Thus, since the driving electrodes 13 connected to the wiring pattern 534 are of the same potential, the wiring pattern 534 which connect those electrodes is formed as a single continuous pattern. Consequently, although a total of fourteen electrodes are formed on the surface and the back of the oscillator 1, only four wiring patterns 531, 532, 533 and 534 are sufficient because the electrodes of the same potential are gathered as described above. Such a decrease in the number of wiring patterns permits the wiring portion 5d to be smaller in width than the oscillator surface- and back-side connecting end portions 5a, 5b. As a result, the wiring portion 5d becomes more flexible and hence easier to absorb oscillations; that is, oscillations from the circuit board 6 are difficult to propagate to the oscillator 1 and vice versa. In this way it is possible to make a detection signal obtained from the oscillator 1 difficult to be affected by an undesired oscillation. Moreover, as shown in FIG. 3A, since the flexible printed circuit board 5 (wiring portion 5d) is bent in U shape between the oscillator 1 and the circuit board 6, this bent portion imparts an elastic force to the wiring portion 5d. Consequently, it becomes easier for oscillations to be absorbed in the bent portion and it becomes difficult for undesired oscillations to be propagated between the oscillator 1 and the circuit board 6.

In FIG. 14, the numerals 531b and 534b denote slits formed in the land portions 531a and 534a, respectively, so as to serve as molten solder sumps. Also in the land portions 531c, 532c, 533c and 534c of the circuit board connecting end portion 5c are formed slits 531b, 532b, 533b and 534b. The land portions 531c, 532c, 533c and 534c of the circuit board connecting end portion 5c are also exposed from a cutout portion 51c formed in the film 51 and can be soldered.

The land portions of the wiring patterns 531, 532, 533 and 534 in the oscillator surface-side connecting end portion 5a, oscillator back-side connecting end portion 5b and circuit board connecting end portion 5c are opposed to the land portions 13a, 13b, 14a, 16a, 16b, 17a1 and 17b1 of the oscillator 1. The land portions of the wiring patterns 531, 532, 533 and 534 are to be subjected to thermowelding and a solder 59 constituted by cream solder or tin-lead plating is provided on copper coil formed by etching (the hatched portions in FIGS. 15 to 17). The solder 59 melts by thermowelding, whereby the land portions 13a, 13b, 14a, 16a, 16b, 17a1, 17b1 and the land portions 531a, 532a, 533a, 534a of the wiring patterns 531, 532, 533, 534 are connected together, as shown in FIG. 17. To be more specific, the oscillator back-side connecting portion 5b is mounted in such a manner that the land portions 13a, 13b, 14a, 13b, 13a on the back of the oscillator 1 and the corresponding land portions 534a, 534a, 531a, 534a, 534a come into abutment against each other. Then, a melting iron called heater chip is brought into abutment against the back side (film 52 side) of the oscillator back-side connecting end portion 5b, followed by the application of pressure and heat. After melting of the solder 59 and consequent interconnection of corresponding land portions, heating is stopped, allowing the solder 59 to harden. Thereafter, the pressure (pressure contact) applied by the heater chip is relieved. The same method is applied also to connection between the land portions on the surface of the oscillator 1 and the corresponding land portions in the oscillator surface-side connecting end portion 5a.

According to the above method, even in the presence of plural land portions 531a, 532a, 533a, 534a and wiring patterns, their connections can be done by only a single thermowelding operation on each of the surface and the back side of the oscillator 1, whereby the assembling work efficiency can be improved. An adhesive (not shown) may be applied to these soldered portions such as a thermosetting adhesive, a room temperature curing adhesive, or an ultraviolet curing adhesive. In this embodiment, in view of a quick curing property and high working efficiency and strength, the soldered portions are coated with an acrylic resin-based ultraviolet curing adhesive (UV curing adhesive). By thus coating the soldered portions (the connection between the oscillator 1 and the flexible printed circuit board 5) with the UV curing adhesive from above, it is possible to attain both protection and reinforcement of the soldered portions.

In connection with the four wiring patterns 531, 532, 533 and 534, the land portions 531a and 534a of the wiring patterns 531 and 534, which are thermowelded to the relatively wide land portions 13a, 13b, 14a and 16a, can also be made large in width. However, in this embodiment, copper foil and solder-free slits 531b and 534b are centrally formed in the land portions 531a and 534a, respectively, whereby the land portions 531a and 534a which would otherwise be large in width can be made small in pattern width. Consequently, the heat of the solder 59 can be raised in a short time through the land portions 531a and 534a, that is, the solder becomes easier to melt. Besides, the thus-melted solder 59 flows into the slits 531b and 534b, so that not only thermowelding can be effected surely in a short time, but also the state of melting of the solder can be checked visually. The land portions 531c, 532c, 533c and 534c formed in the circuit board connecting end portion 5c, as is the case with the foregoing land portions formed in the oscillator back-side connecting end portion 5b, are also thermowelded by solder to the corresponding conductive patterns (not shown) on the circuit board 6, and their connected portions are reinforced by applying a UV curing adhesive thereto.

Figure 18A:
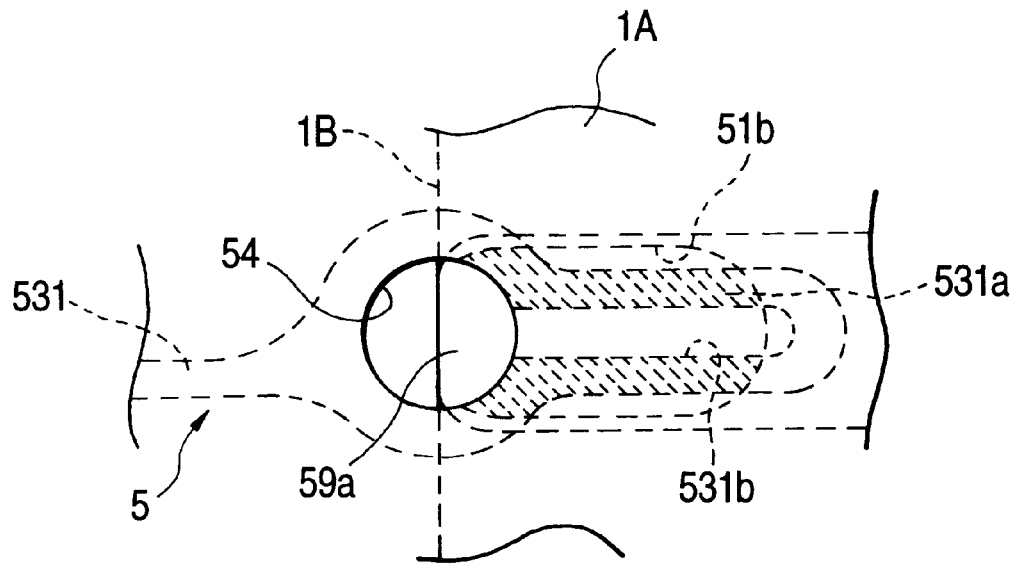
FIG. 18A is a partial plan view showing a soldered portion of the oscillator and the flexible printed circuit board and FIG. 18B is a sectional view thereof.
Figure 18B:
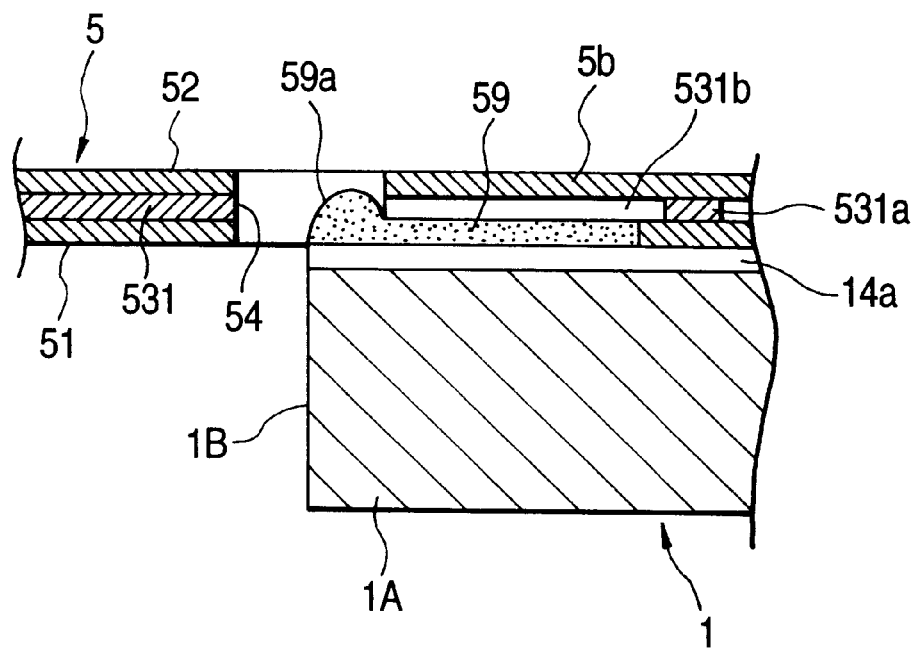
Figure 19:
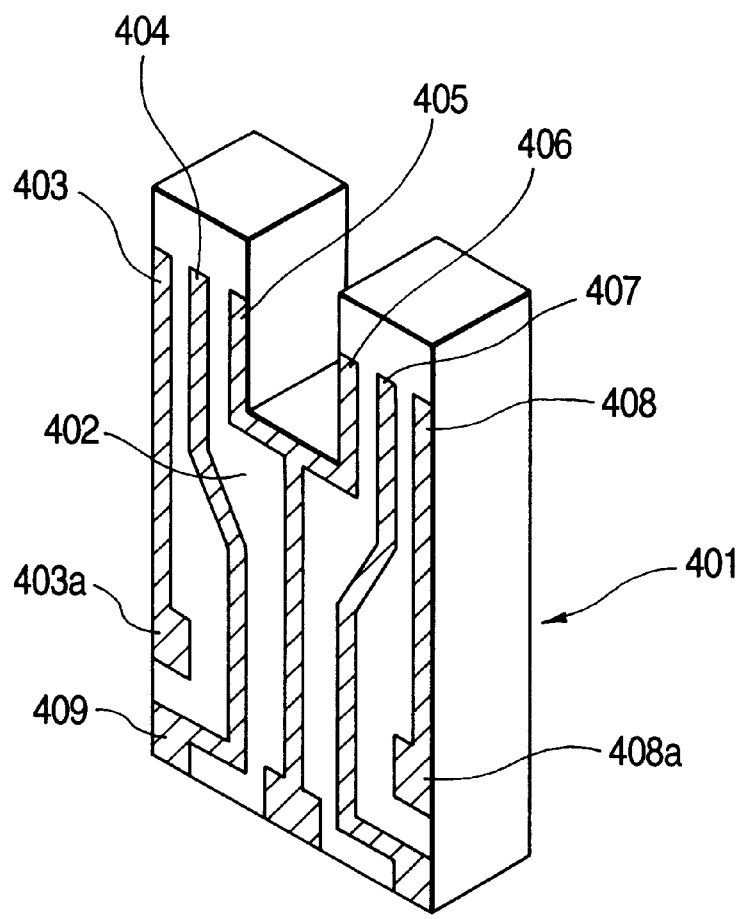
FIG. 19 is a perspective view showing an oscillator used in a conventional oscillation type gyroscope.

As an example, reference will be made below to the portion of solder 59 of the wiring pattern 531 in the oscillator back-side connecting end portion 5b thermowelded to the land portion 14a which is shown in FIG. 18.

As shown in FIGS. 15 to 18, a through hole (a solder sump hole) is formed in the oscillator back-side connecting end portion 5b of the flexible printed circuit board 5 so as to be positioned in the end face 1B of the oscillator 1. The through hole 54 is in communication with the slit 531b formed in the land portion 531a of the oscillator back-side connecting end portion 5b, with film 52 being present in the slit 531b.

When the oscillator back-side connecting end portion 5b and the oscillator 1 are put one on the other and thermowelded, the solder 59 melts and extra solder 59 fills the interior of the slit 531b, and still overflowing solfer 59a gathers in the interior portion of the through hole 54 where the land portion 14a is present. As shown in FIGS. 14 to 17, such through holes 54 which constitute solder sumps as just described above are also formed in the portion extending partially across the land portions 532a and 533a of the oscillator surface-side connecting end portion 5a which are soldered to the land portions 17b1 and 17a1, respectively, of the oscillator 1.

In the land portions 532a and 533a there may be formed similar slits which are the same as the slits formed in the land portions 531a and 534a to improve the solderability thereof.

Since the ground electrode 14 is not used during polarization, a modification may be made such that the land portion 14a does not reach the end face 1B of the oscillator As described above, the oscillation type gyroscope of the above embodiment comprises the oscillator 1 formed by a generally plate-like piezoelectric substrate, the oscillator 1 having belt-like electrodes for driving and for detection formed on both the surface and the back surface of the oscillator, the electrodes extending from a front to a base end portion of the oscillator, the oscillator also having oscillating arms 12a, 12b and 12c adapted to oscillate in a cantilevered state, with front end portions of the oscillating arms being free ends; the support member 4 for supporting the base end portion 1A of the oscillator 1; the circuit board 6 to which the support member 4 is secured; the flexible printed circuit board 5 with wiring patterns formed thereon and having at least the oscillator-side end portions 5a, 5b, the circuit board-side end portion 5c and the wiring portion 5d positioned between the oscillator-side end portions 5a, 5b and the circuit board-side end portion 5c; the first connecting portions provided in the oscillator-side end portions 5a and 5b of the flexible printed circuit board 5, conducted with the wiring patterns and connected electrically by soldering to corresponding electrodes at the base end portion 1A of the oscillator 1; the second connecting portion provided in the circuit board-side end portion 5c of the flexible printed circuit board 5, conducted with the wiring patterns and connected electrically to the circuit board 6 at the circuit board-side end portion 5c; and the case 2 which houses therein the oscillator 1, support member 4, flexible printed circuit board 5 and circuit board 6, wherein among the electrodes, those which lie in the same plane and which become equal in potential at the time of polarization and in use, are gathered as one group at the base end portion of the oscillator. Thus, the oscillator 1 is not directly secured to the circuit board 6, but both are connected together through the flexible printed circuit board 5. Therefore, oscillations are difficult to propagate between the circuit board 6 and the oscillator 1, that is, the detection of a signal is difficult to be affected by undesired oscillations and hence can be effected more accurately. Besides, since the electrodes which lie in the same plane and which become equal in potential at the time of polarization and in use, are gathered as one group at the base end portion 1A of the oscillator 1, the space of the other electrodes (13a, 14a) in the portion connected to the flexible printed circuit board 5 can be taken wide, whereby it is possible to prevent short-circuit and improve the soldering work efficiency.

In the above embodiment, among the electrodes, as to the electrode (16a) not used for polarization, its end portion on the base end portion 1A side of the oscillator 1 is formed shorter than the other electrodes (17a1, 17b1, . . . ), so that the electrode area of the portion connected to the flexible printed circuit board 5 can be made large and hence the soldering work efficiency by thermowelding for example can be improved. During polarization, moreover, since all the electrodes used for polarization on the piezoelectric ceramic substrate extend up to the end portion 1B of the base end portion 1A (when divided), it is not necessary to extend polarization patterns sideways as in the prior art, but the polarization patterns can be extended as they are in the longitudinal direction beyond the end portion 1B. Therefore, in the case of fabricating plural oscillators 1 from a singe piezoelectric substrate 101, it is possible to diminish the space between adjacent oscillators, with the result that the manufacturing yield of the piezoelectric substrate 101 is high and the oscillators can be fabricated at low cost.

In the above embodiment, since the wiring portion 5d of the flexible printed circuit board is smaller in width than the oscillator-side end portions 5a, 5b and the circuit board-side end portion 5c, oscillations from the circuit board 6 are difficult to propagate to the oscillator. Conversely, oscillations from the oscillator 1 are also difficult to propagate to the circuit board 6. Consequently, a detection signal obtained from the oscillator 1 is difficult to be affected by undesired oscillations.

In the above embodiment, as to at least adjacent electrodes (13a and 13b, or 16b and 16b) which become equal in potential in use, the corresponding connecting portions (531a or 534a) are connected with each other in the oscillator-side end portions 5a and 5b and a wiring pattern conductive with those connecting portions is formed as a common wiring pattern in the wiring portion 5d, so that the width of the wiring portion 5d can be made narrow and hence it is possible to make oscillations more difficult to propagate between the oscillator 1 and the circuit board 6.

In the above embodiment, the flexible printed circuit board 5 is provided with the branch portion 5e at which the wiring portion 5d branches into two on the oscillator 1 side with respect to the central part and is also provided with the oscillator-side end portion 5a for the surface of the oscillator 1 and the oscillator-side end portion 5b for the back of the oscillator, and the connecting portions (531a, 532a, 533a, 534a) provided at the oscillator-side end portions 5a and 5b are connected to the corresponding electrodes (13a, 16a, 17a1, 17b1) formed on both sides of the oscillator 1. Therefore, even if electrodes are present on both sides of the oscillator 1, a single flexible printed circuit board 5 is sufficient, whereby not only the reduction of cost can be attained, but also the number of components is reduced and the working efficiency is improved in comparison with the case of using a flexible printed circuit board for each side of the oscillator 1, that is, using two flexible printed circuit boards.

In the above embodiment, the wiring patterns 531 conductive with electrodes (14a and 16a) which become equal in potential in use on the surface and the back surface of the oscillator 1 are gathered at the branch portion 5e of the flexible printed circuit board 5 and reach the circuit board-side end portion 5c and so a common wiring pattern is disposed in the wiring portion 5d between the branch portion 5e and the circuit board-side end portion 5c. Consequently, even where there are electrodes which become equal in potential on both sides of the oscillator 1, the associated wiring patterns can be gathered to prevent widening of the wiring portion 5d.

In the above embodiment, the electrodes of the oscillator 1 are formed by printing a paste consisting principally of silver, and cream solder or tin-lead plating is applied to the connecting portions (531a, 532a, 533a, 534a) provided at the oscillator-side end portions 5a and 5b of the flexible printed circuit board 5. The solder is melted by thermowelding to connect the land portions (13a, 16a, 17a1, 17b1) of electrodes and the connecting portions (531a, 532a, 533a, 534a) with each other. Therefore, even where there are plural electrodes on the oscillator 1 and plural wiring patterns (connecting portions) on the flexible printed circuit board 5, the aforesaid connection can be done by a single thermowelding operation for one side of the oscillator 1, whereby the working efficiency can be further improved.

In the above embodiment, moreover, since an adhesive is applied to the thermowelded connections between the electrodes (13a, 16a, 17a1, 17b1) and the connecting portions (531a, 532a, 533a, 534a) at the oscillator-side end portions 5a and 5b, the connections are difficult to break even if an undesired force is exerted thereon.

According to the invention, since the oscillator is not directly attached to the circuit board but both are connected together through a flexible printed circuit board, oscillations are difficult to propagate between the circuit board and the oscillator, thus permitting a more accurate detection of a signal. Further, since the electrodes which lie in the same plane and which become equal in potential at the time of polarization and in use, are gathered as one group at the base end portion of the oscillator, it is possible to take wide the space of other electrodes at their connected portion to the flexible printed circuit board, whereby it is possible to prevent short-circuit and improve the soldering work efficiency.

Further, according to the invention, all the electrodes used for polarization can be extended as they are in the longitudinal direction beyond the base end portion (when divided) on the piezoelectric ceramic substrate during polarization, so when a plurality of oscillators are to be fabricated from a single piezoelectric substrate, it is possible to diminish the space between adjacent oscillators and therefore possible to attain a high manufacturing yield of the piezoelectric substrate and reduction of cost.

Further, according to the invention, since the wiring portion of the flexible printed circuit board is narrow, oscillations from the circuit board are difficult to propagate to the oscillator and vice versa. Consequently, a detection signal obtained from the oscillator becomes difficult to be affected by undesired oscillations.

Further, according to the invention, since there is used a common wiring pattern, the width of the wiring portion can be made still smaller and therefore it is possible to make it difficult for oscillations to propagate between the oscillator and the circuit board.

Further, according to the invention, even if electrodes are present on both sides of the oscillator, a single flexible printed circuit board is sufficient, so that not only the reduction of cost can be attained, but also the number of components used decreases and the working efficiency is improved in comparison with using a flexible printed circuit board for each side of the oscillator, that is, using two flexible printed circuit boards.

Further, according to the invention, since a common wiring pattern is disposed in the wiring portion between the branch portion of the flexible printed circuit board and the circuit board-side end portion thereof, it is possible to prevent the wiring portion from become wider even in the area where there are electrodes on both sides of the oscillator which electrodes become equal in potential in use.

Further, according to the invention, even when there are plural electrodes on the oscillator and plural connecting portions on the flexible printed circuit board, it is possible to effect connection by a single thermowelding operation for each side of the oscillator and hence it is possible to further improve the working efficiency.

Further, according to the invention, even if an undesired force is exerted on the connections between the electrodes on the oscillator and the connecting portions of wiring patterns on the flexible printed circuit board, it is possible to make the connections difficult to break.

What is claimed is:

1. An oscillation type gyroscope comprising:

an oscillator having electrodes for driving and for detection formed on both the surface and the back surface of the oscillator and also having oscillating arms adapted to oscillate in a cantilevered state, with front end portions of said oscillating arms being free ends;

a support member for supporting a base end portion of said oscillator;

a circuit board to which said support member is secured;

a flexible printed circuit board with wiring patterns formed thereon and having at least an oscillator-side end portion, a circuit board-side end portion and a wiring portion positioned between said oscillator-side end portion and said circuit board-side end portion;

first connecting portions provided in said oscillator-side end portion of said flexible printed circuit board, conducted with said wiring patterns and connected to corresponding electrodes among said electrodes electrically by soldering at the base end portion of said oscillator; and a second connecting portion provided in the circuit board-side end portion of said flexible printed circuit board, conducted with said wiring patterns and connected electrically to said circuit board at the circuit board-side end portion, wherein among the electrodes of the oscillator, those which lie in the same plane and which become equal in potential at the time of polarization and in use, are gathered as one group at the base end portion of said oscillator.

2. An oscillation type gyroscope according to claim 1, wherein among said electrodes, those used for polarization are all extended up to an end portion on the base end side of said oscillator.

3. An oscillation type gyroscope according to claim 1, wherein said wiring portion of said flexible printed circuit board is smaller in width than said oscillation-side end portion and said circuit board-side end portion.

4. An oscillation type gyroscope according to claim 3, wherein among said electrodes, at least as to those adjacent to each other and becoming equal in potential in use, the corresponding first connecting portions are connected with each other in said oscillator-side end portion, and a wiring pattern conducted with said first connecting portions is formed as a common wiring pattern in said wiring portion.

5. An oscillation type gyroscope according to claim 4, wherein said flexible printed circuit board is provided with two branch portions resulting from branching of said wiring portion on said oscillator side with respect to a central side and is also provided with two said oscillator-side end portions one of which is for the surface of said oscillator and the other of which is for the back of the oscillator, and said first connecting portions are formed at said oscillator-side end portions and are connected to corresponding electrodes formed on both sides of the oscillator.

6. An oscillation type gyroscope according to claim 5, wherein said wiring patterns conducted respectively with the electrodes which become equal in potential at both the surface and the back surface of said oscillator are gathered in said branch portions and are extended up to said circuit board-side end portion.

7. An oscillation type gyroscope according to claim 5, wherein said electrodes of the oscillator are formed by printing of a paste consisting principally of silver, and cream solder or tin-lead plating is applied to said first connecting portions formed in said oscillator-side end portions of said flexible printed circuit board so that the solder is melted by thermowelding to connect said electrodes and said first connecting portions in said oscillator-side end portions with each other.

8. An oscillation type gyroscope according to claim 7, wherein an adhesive is applied to the thermowelded connections between said electrodes and said first connecting portions in said oscillator-side end portions.

* * * * *